United States Patent
Harada et al.

(10) Patent No.: US 12,101,925 B2
(45) Date of Patent: Sep. 24, 2024

(54) MEMORY DEVICE USING SEMICONDUCTOR ELEMENTS

(71) Applicant: Unisantis Electronics Singapore Pte. Ltd., Singapore (SG)

(72) Inventors: Nozomu Harada, Tokyo (JP); Koji Sakui, Tokyo (JP)

(73) Assignee: UNISANTIS ELECTRONICS SINGAPORE PTE. LTD., Singapore (SG)

( * ) Notice: Subject to any disclaimer, the term of this patent is extended or adjusted under 35 U.S.C. 154(b) by 400 days.

(21) Appl. No.: 17/739,849

(22) Filed: May 9, 2022

(65) Prior Publication Data
US 2022/0367468 A1 Nov. 17, 2022

(30) Foreign Application Priority Data
May 11, 2021 (WO) .................. PCT/JP2021/017858

(51) Int. Cl.
*H10B 12/00* (2023.01)
*G11C 11/4097* (2006.01)

(52) U.S. Cl.
CPC .......... *H10B 12/20* (2023.02); *G11C 11/4097* (2013.01)

(58) Field of Classification Search
None
See application file for complete search history.

(56) References Cited

U.S. PATENT DOCUMENTS

| 2003/0111681 A1 | 6/2003 | Kawanaka |
| 2006/0049444 A1 | 3/2006 | Shino |

(Continued)

FOREIGN PATENT DOCUMENTS

| JP | H 02-188966 A | 7/1990 |
| JP | H 03-171768 A | 7/1991 |

(Continued)

OTHER PUBLICATIONS

Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, vol. 38, No. 3, pp. 573-578 (1991).

(Continued)

*Primary Examiner* — Anthony Ho
(74) *Attorney, Agent, or Firm* — Crowell & Moring LLP

(57) ABSTRACT

Provided on a substrate are an $N^+$ layer connecting to a source line SL and an $N^+$ layer connecting to a bit line BL that are located at opposite ends of a Si pillar standing in an upright position along the vertical direction, an N layer continuous with the $N^+$ layer, an N layer continuous with the $N^+$ layer, a first gate insulating layer surrounding the Si pillar, a first gate conductor layer surrounding the first gate insulating layer and connecting to a plate line PL, and a second gate conductor layer surrounding a second gate insulating layer surrounding the Si pillar and connecting to a word line WL. A voltage applied to each of the source line SL, the plate line PL, the word line WL, and the bit line BL is controlled to perform a data retention operation for retaining holes, which have been generated through an impact ionization phenomenon or using a gate induced drain leakage current, in a channel region of the Si pillar, and a data erase operation for removing the holes from the channel region.

9 Claims, 17 Drawing Sheets

(56) References Cited

U.S. PATENT DOCUMENTS

2008/0137394 A1    6/2008    Shimano
2008/0212366 A1    9/2008    Ohsawa

FOREIGN PATENT DOCUMENTS

| | | |
|---|---|---|
| JP | 2006-080280 A | 3/2006 |
| JP | 3957774 B2 | 8/2007 |
| JP | 2008-218556 A | 9/2008 |

OTHER PUBLICATIONS

H. Chung, H. Kim, H. Kim, K. Kim, S. Kim, K. Dong, J. Kim, Y. C. Oh, Y. Hwang, H. Hong, G. Jin, and C. Chung: "Novel 4F2 DRAM Cell with Vertical Pillar Transistor (VPT)," 2011 Proceeding of the European Solid-State Device Research Conference, (2011).

H. S. Philip Wong, S. Raoux, S. Kim, Jiale Liang, J. R. Reifenberg, B. Rajendran, M. Asheghi and K. E. Goodson: "Phase Change Memory," Proceeding of IEEE, vol. 98, No. 12, December, pp. 2201-2227 (2010).

T. Tsunoda, K. Kinoshita, H. Noshiro, Y. Yamazaki, T. Iizuka, Y. Ito, A. Takahashi, A. Okano, Y. Sato, T. Fukano, M. Aoki, and Y. Sugiyama: "Low Power and high Speed Switching of Ti-doped NiO ReRAM under the Unipolar Voltage Source of less than 3V," IEDM (2007).

W. Kang, L. Zhang, J. Klein, Y. Zhang, D. Ravelosona, and W. Zhao: "Reconfigurable Codesign of STT-MRAM Under Process Variations in Deeply Scaled Technology," IEEE Transaction on Electron Devices, pp. 1-9 (2015).

M. G. Ertosum, K. Lim, C. Park, J. Oh, P. Kirsch, and K. C. Saraswat: "Novel Capacitorless Single-Transistor Charge-Trap DRAM (1T CT DRAM) Utilizing Electron," IEEE Electron Device Letter, vol. 31, No. 5, pp. 405-407 (2010).

J. Wan, L. Rojer, A. Zaslavsky, and S. Critoloveanu: "A Compact Capacitor-Less High-Speed DRAM Using Field Effect-Controlled Charge Regeneration," Electron Device Letters, vol. 35, No. 2, pp. 179-181 (2012).

T. Ohsawa, K. Fujita, T. Higashi, Y. Iwata, T. Kajiyama, Y. Asao, and K. Sunouchi: "Memory design using a one-transistor gain cell on SOI," IEEE JSSC, vol. 37, No. 11, pp. 1510-1522 (2002).

T. Shino, N. Kusunoki, T. Higashi, T. Ohsawa, K. Fujita, K. Hatsuda, N. Ikumi, F. Matsuoka, Y. Kajitani, R. Fukuda, Y. Watanabe, Y. Minami, A. Sakamoto, J. Nishimura, H. Nakajima, M. Morikado, K. Inoh, T. Hamamoto, A. Nitayama: "Floating Body RAM Technology and its Scalability to 32nm Node and Beyond," IEEE IEDM (2006).

E. Yoshida and T. Tanaka: "A Design of a Capacitorless 1T-DRAM Cell Using Gate-induced Drain Leakage (GIDL) Current for Low-power and High-speed Embedded Memory," IEEE IEDM, pp. 913-916, Dec. 2003.

J. Y. Song, W. Y. Choi, J. H. Park, J. D. Lee, and B-G. Park: "Design Optimization of Gate-All-Around (GAA) MOSFETs," IEEE Trans. Electron Devices, vol. 5, No. 3, pp. 186-191, May 2006.

N. Loubet, et al.: "Stacked Nanosheet Gate-All-Around Transistor to Enable Scaling Beyond FinFET," 2017 IEEE Symposium on VLSI Technology Digest of Technical Papers, T17-5, T230-T231, Jun. 2017.

H. Jiang, N. Xu, B. Chen, L. Zeng1, Y. He, G. Du, X. Liu and X. Zhang: "Experimental investigation of self heating effect (SHE) in multiple-fin SOI FinFETs," Semicond. Sci. Technol. 29 (2014) 115021 (7 pp).

E. Yoshida, and T. Tanaka: "A Capacitorless 1T-DRAM Technology Using Gate-Induced Drain-Leakage (GIDL) Current for Low-Power and High-Speed Embedded Memory," IEEE Transactions on Electron Devices, vol. 53, No. 4, pp. 692-697, Apr. 2006.

F. Morishita, H. Noda, I. Hayashi, T. Gyohten, M. Oksmoto, T. Ipposhi, S. Maegawa, K. Dosaka, and K. Arimoto: "A Capacitorless Twin-Transistor Random Access Memory (TTRAM) on SOI," IEICE Trans. Electron., vol. E90-c., No. 4 pp. 765-771 (2007).

International Search Report (PCT/ISA/210) (Japanese) from PCT/JP2021/017858 dated Jun. 29, 2021, 3 pgs. See a translation.

English translation of International Search of Search Report (PCT/ISA/210) of PCT/JP2021/017858, 2 pgs.

Written Opinion (PCT/ISA/237) (Japanese) of PCT/JP2021/017858 dated Jun. 22, 2021, 3 pgs.

F. Morishita, H. Noda, I. Hayashi, T. Gyohten, M. Okamoto, T. Ipposhi, S. Maegawa, K. Dosaka, and K. Arimoto: "A Capacitorless Twin-Transistor Random Access Memory (TTRAM) on SOI," IEICE Trans. Electron., vol. E90-c., No. 4 pp. 765-771 (2007) a brief description.

FIG. 2A  "1" WRITTEN STATE
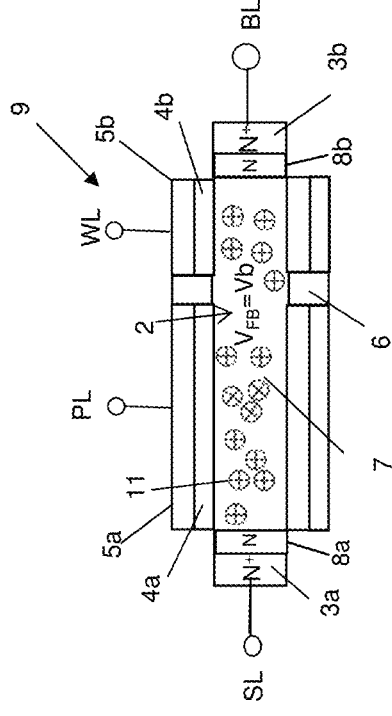
FIG. 2B  "0" ERASE OPERATION
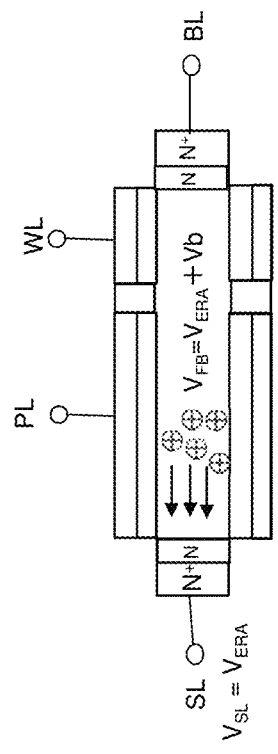
Vb: Built-in Voltage ~0.7V
BUILT-IN VOLTAGE TO 0.7 V
FIG. 2C
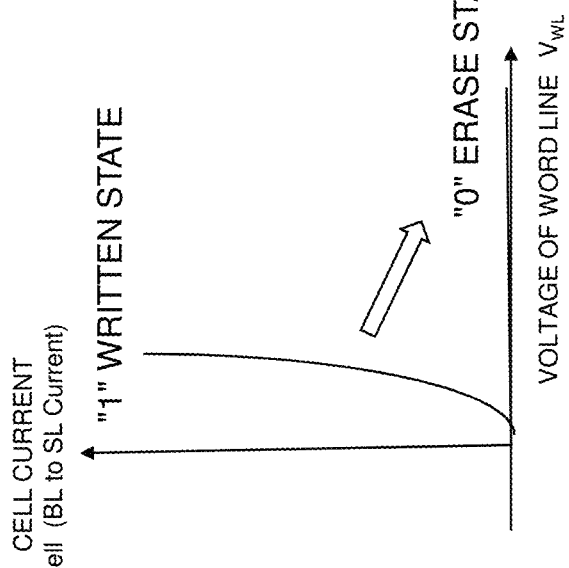

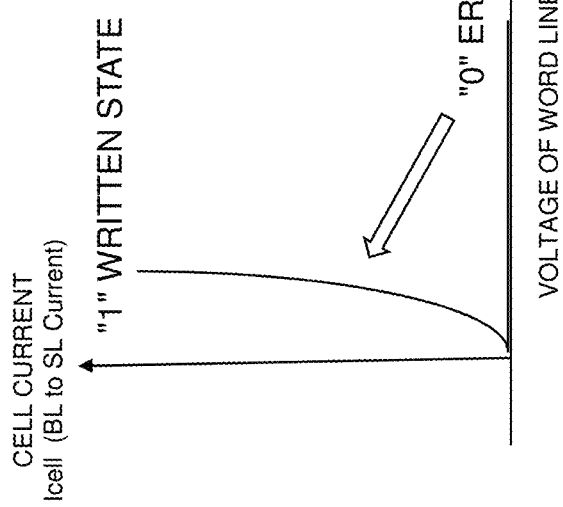
FIG. 3C
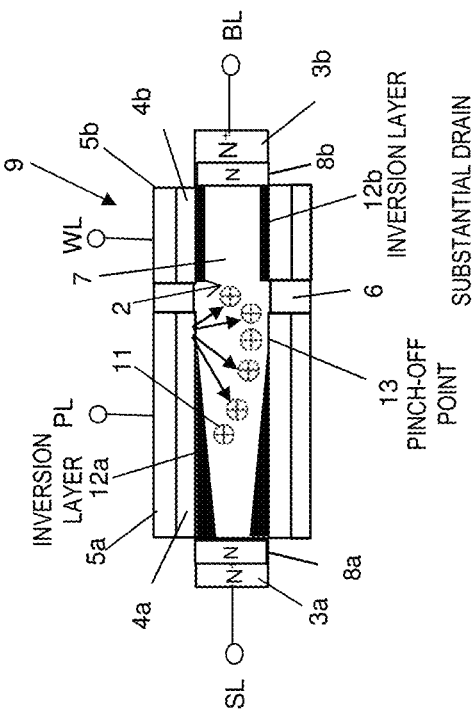
FIG. 3A "1" WRITE OPERATION
SOURCE-SIDE IMPACT IONIZATION
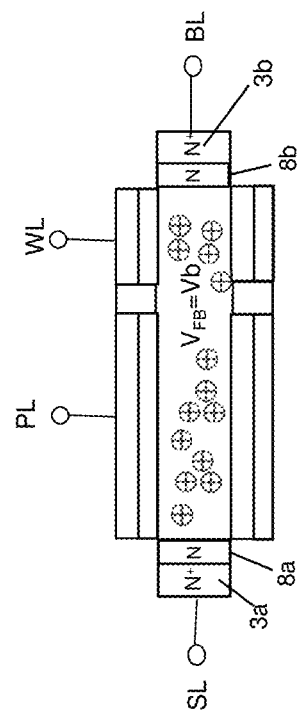
FIG. 3B "1" WRITTEN STATE

FIG. 4AA  "1" WRITTEN STATE

FIG. 4AB  "0" ERASE STATE

Vb: BUILT-IN VOLTAGE TO 0.7 V

BL: BIT LINE
SL: SOURCE LINE
WL: WORD LINE
PL: PLATE LINE
FB: FLOATING BODY $C_{FB} = C_{PL} + C_{WL} + C_{BL} + C_{SL}$ $$\Delta V_{FB} = V_{FB2} - V_{FB1}$$
$$= \frac{C_{WL}}{C_{PL} + C_{WL} + C_{BL} + C_{SL}} \times V_{ReadWL} \quad (1)$$

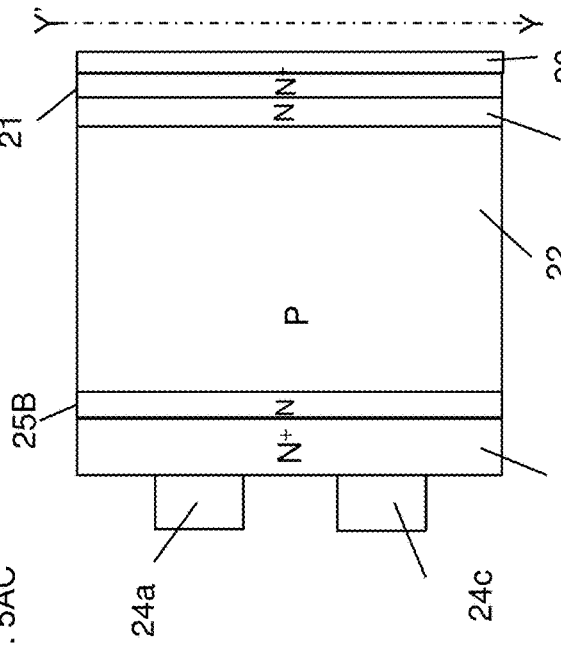
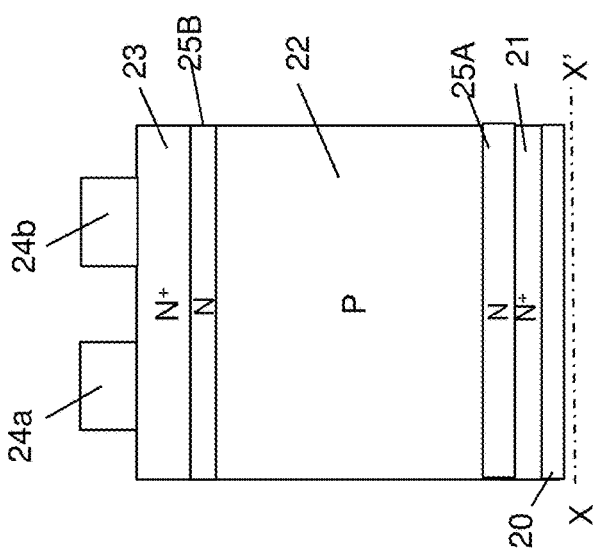
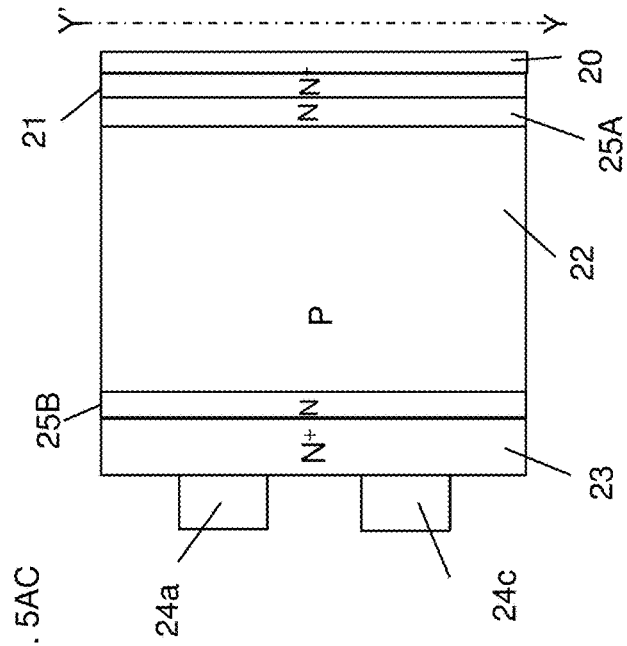
FIG. 5AC
FIG. 5AA
FIG. 5AB

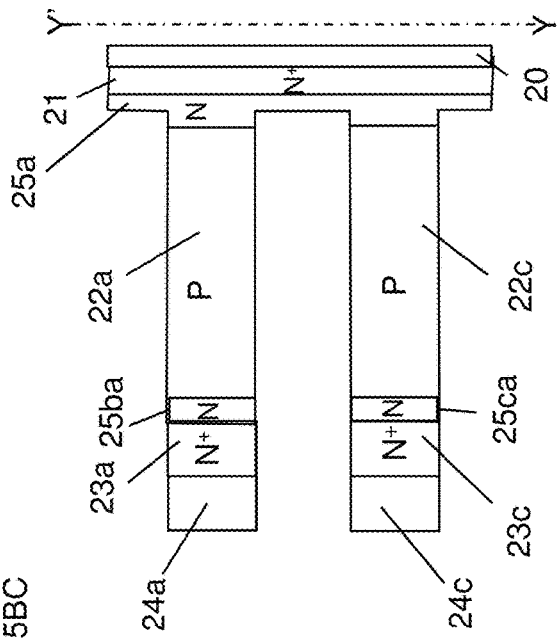
FIG. 5BC
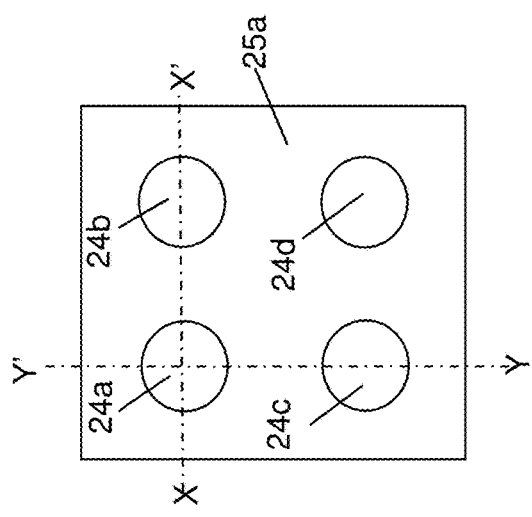
FIG. 5BA
FIG. 5BB

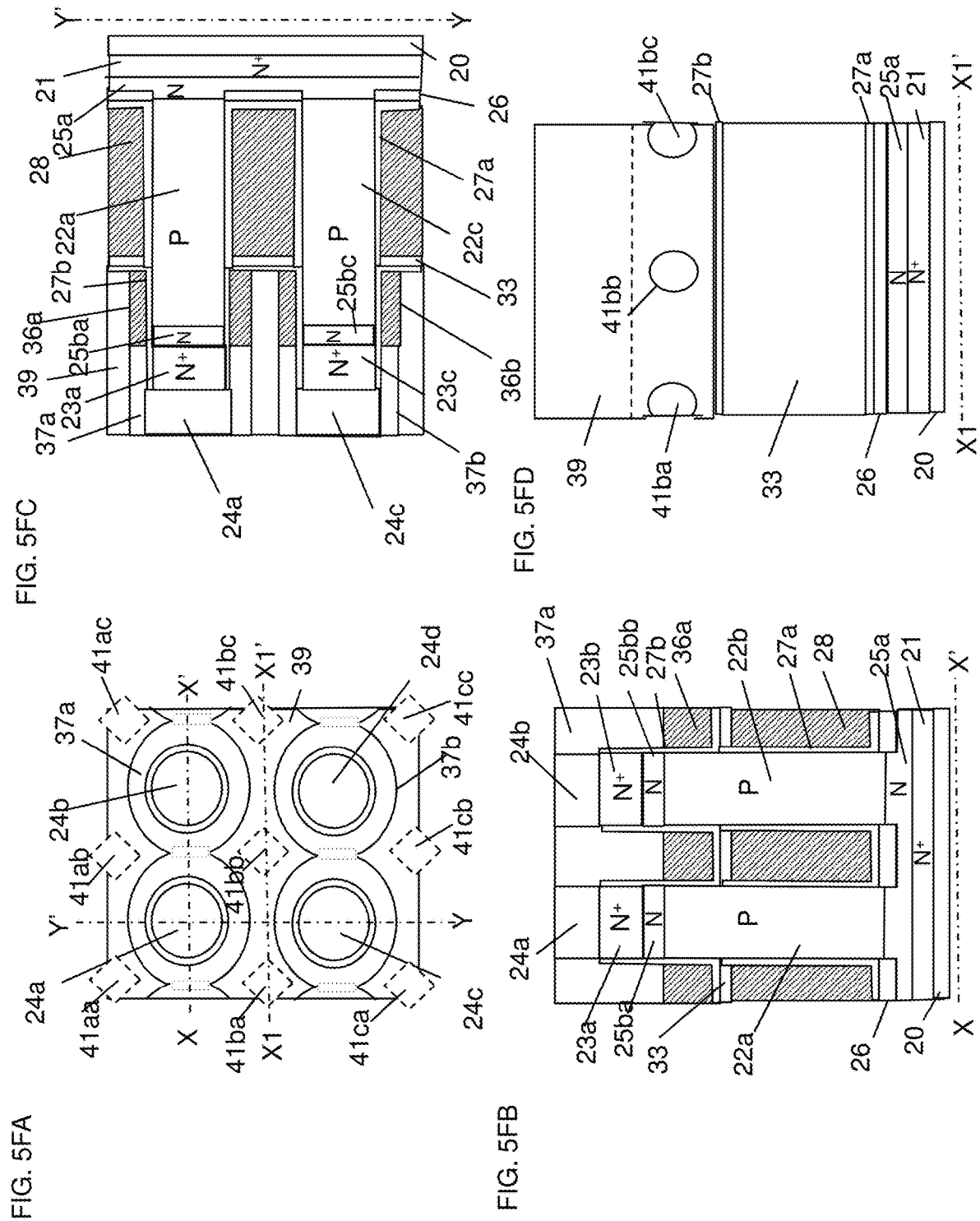

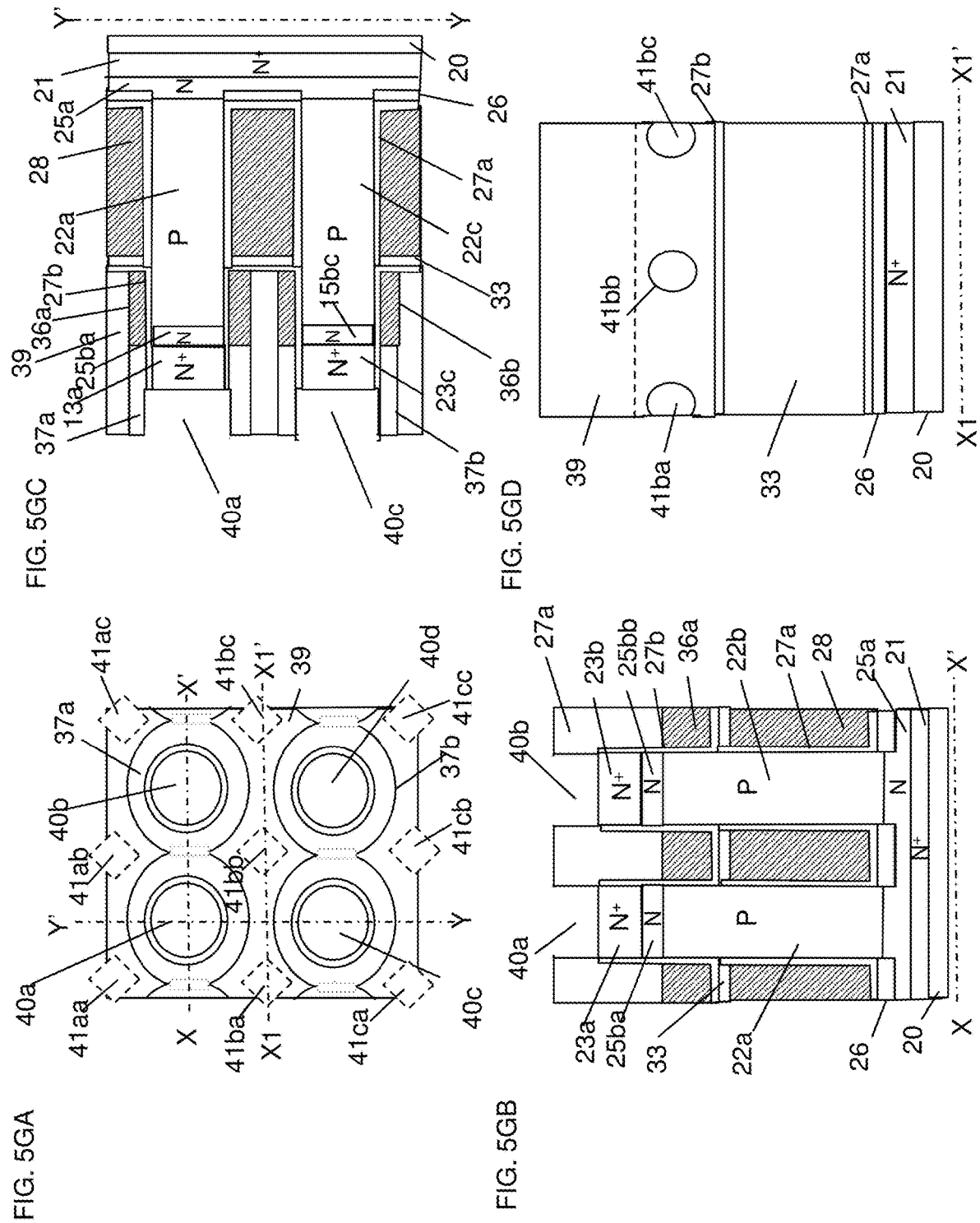

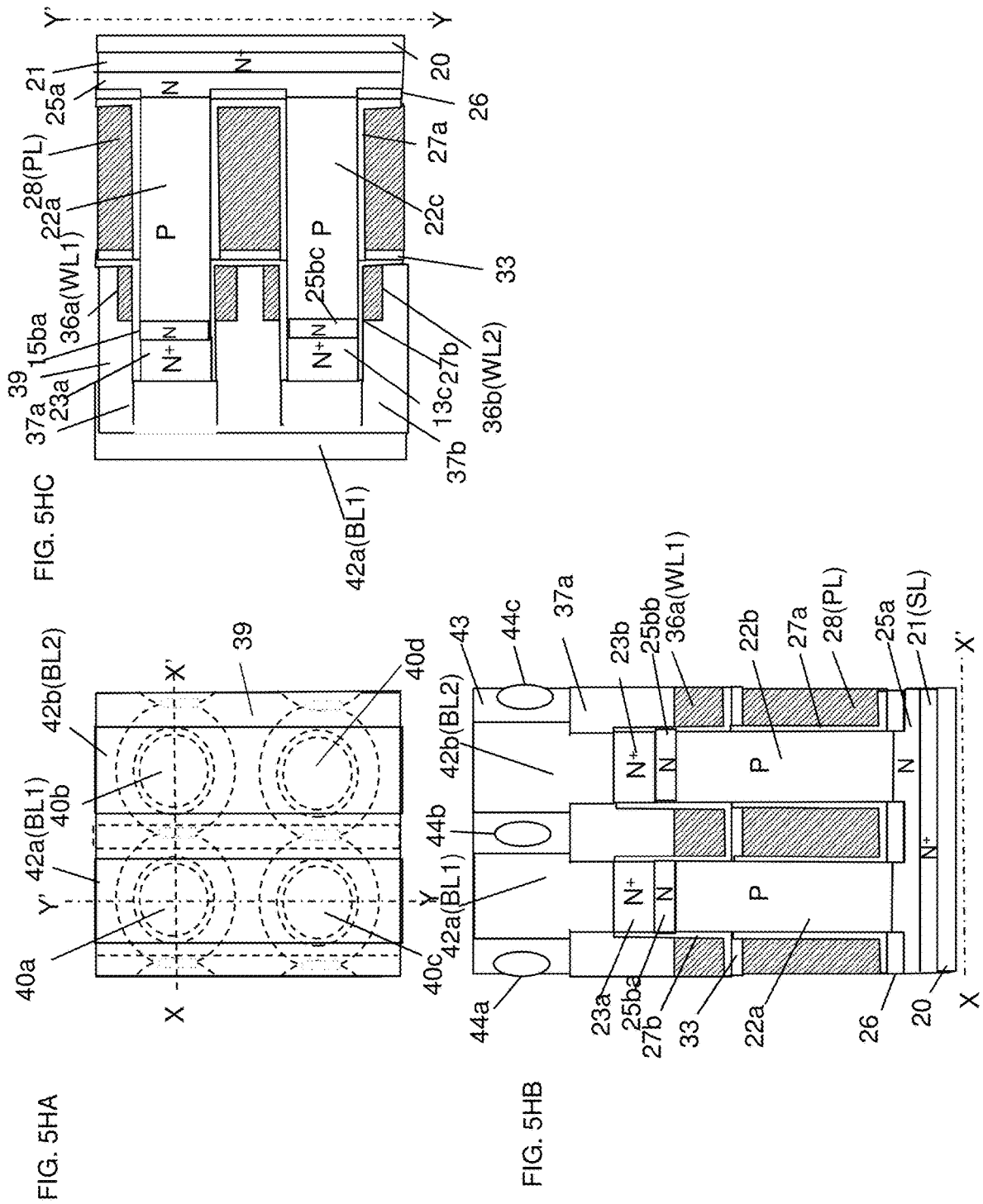

$C_{FB} = C_{WL} + C_{BL} + C_{SL}$   Expression (1)

$\Delta V_{FB} = V_{FB2} - V_{FB1}$ $= \dfrac{C_{WL}}{C_{WL} + C_{BL} + C_{SL}} \times V_{ProgWL}$   Expression (2)

$\beta = \dfrac{C_{WL}}{C_{WL} + C_{BL} + C_{SL}}$   Expression (3)

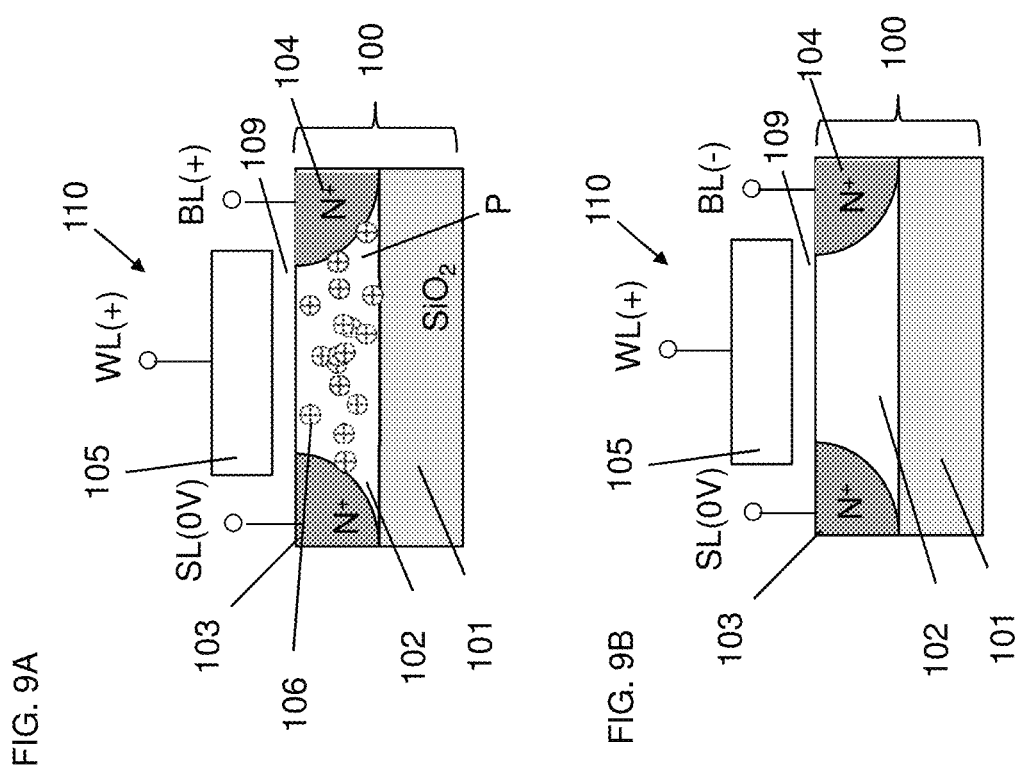

MEMORY DEVICE USING SEMICONDUCTOR ELEMENTS

CROSS-REFERENCE TO RELATED APPLICATIONS

This application claims priority to PCT/JP2021/017858, filed May 11, 2021, the entire content of which is incorporated herein by reference.

TECHNICAL FIELD

The present invention relates to a memory device using semiconductor elements.

BACKGROUND ART

In recent years, a higher degree of integration and higher performance of memory devices have been demanded in the development of the LSI (Large Scale Integration) technology.

In a common planar MOS transistor, a channel extends in the horizontal direction along the upper surface of a semiconductor substrate. In contrast, a channel of a SGT extends in a direction perpendicular to the upper surface of a semiconductor substrate (for example, see Patent Literature 1 and Non Patent Literature 1). Therefore, when SGTs are used, the density of a semiconductor device can be increased more than when planar MOS transistors are used. Using such SGTs as selection transistors can achieve a high degree of integration of, for example, DRAM (Dynamic Random Access Memory) with a capacitor connected thereto (for example, see Non Patent Literature 2), PCM (Phase Change Memory) with a variable resistance element connected thereto (for example, see Non Patent Literature 3), RRAM (Resistive Random Access Memory; for example, see Non Patent Literature 4), and MRAM (Magneto-resistive Random Access Memory) whose resistance is changed by changing the direction of a magnetic spin using a current (for example, see Non Patent Literature 5). There is also known a capacitorless DRAM memory cell including a single MOS transistor (see Non Patent Literature 6), for example. The present application relates to dynamic flash memory that can be formed with only a MOS transistor and without a variable resistance element or a capacitor.

FIGS. 7A to 7D illustrate a write operation for the aforementioned capacitorless DRAM memory cell including a single MOS transistor, FIGS. 8A and 8B illustrate problems with the operation thereof, and FIGS. 9A to 9C illustrate a read operation (see Non Patent Literatures 7 to 10).

FIGS. 7A to 7D illustrate a write operation for the DRAM memory cell. FIG. 7A illustrates a "1" written state. Herein, the memory cell includes a source N$^+$ layer 103 (hereinafter, a semiconductor region containing a high concentration of donor impurities shall be referred to as an "N$^+$ layer") connecting to a source line SL and a drain N$^+$ layer 104 connecting to a bit line BL, each formed in a SOI substrate 100; a gate conductive layer 105 connecting to a word line WL; and a floating body 102 of a MOS transistor 110a. The DRAM memory cell does not include a capacitor, and is formed with a single MOS transistor 110a. It should be noted that the floating body 102 is in contact with a SiO$_2$ layer 101 of the SOI substrate immediately below the floating body 102. When "1" is written to such a memory cell including a single MOS transistor 110a, the MOS transistor 110a is operated in the saturation region. That is, a channel 107 for electrons extending from the source N$^+$ layer 103 has a pinch-off point 108, and thus does not reach the drain N$^+$ layer 104 connecting to the bit line. When the MOS transistor 110a is operated while each of the bit line BL connected to the drain N$^+$ layer 104 and the word line WL connected to the gate conductive layer 105 is set at a high voltage and the gate voltage is set at a level of about ½ that of the drain voltage, the intensity of an electric field becomes maximum at the pinch-off point 108 around the drain N$^+$ layer 104. Consequently, accelerated electrons flowing from the source N$^+$ layer 103 to the drain N$^+$ layer 104 collide with Si lattices, and electron-hole pairs are generated due to the kinetic energy lost during the collision (i.e., an impact ionization phenomenon). Most of the generated electrons (not illustrated) reach the drain N$^+$ layer 104. Meanwhile, only some of the electrons that are very hot reach the gate conductive layer 105 beyond a gate oxide film 109. In addition, holes 106 generated at the same time charge the floating body 102. In such a case, since the floating body 102 is p-type Si, the generated holes contribute to increasing the majority carriers. When the floating body 102 is filled with the generated holes 106 and the voltage of the floating body 102 becomes higher than that of the source N$^+$ layer 103, specifically, Vb or greater, the generated holes are further released to the source N$^+$ layer 103. Herein, Vb is the built-in voltage of a P-N junction between the source N$^+$ layer 103 and the floating body 102 as the P-layer, and is about 0.7 V. FIG. 7B illustrates a view in which the floating body 102 is saturated with and charged with the generated holes 106.

Next, an operation of writing "0" to the memory cell 110 will be described with reference to FIG. 7C. With respect to a common selected word line WL, there randomly exist memory cells 110a to which "1" is written and memory cells 110b to which "0" is written. FIG. 7C illustrates a view in which the state of the memory cell 110 changes from the "1" written state to the "0" written state. When "0" is written, the bit line BL is set at a negative bias voltage so that a P-N junction between the drain N$^+$ layer 104 and the floating body 102 as the P-layer is forward-biased. Consequently, the holes 106, which have been generated in the floating body 102 in advance in the previous cycle, flow to the drain N$^+$ layer 104 connected to the bit line BL. When the write operation is complete, two states of the memory cells are obtained that include the memory cells 110a filled with the generated holes 106 (FIG. 7B) and the memory cells 110b from which the generated holes have been discharged (FIG. 7C). The potential of the floating body 102 in the memory cell 110a filled with the holes 106 is higher than that of the floating body 102 without holes generated therein. Thus, the threshold voltage of the memory cell 110a is lower than the threshold voltage of the memory cell 110b. FIG. 7D illustrates such a state.

Next, problems with the operation of such a memory cell including a single MOS transistor will be described with reference to FIGS. 8A and 8B. As illustrated in FIG. 8A, the capacitance $C_{FB}$ of the floating body 102 is equal to the sum of the capacitance OWL between the gate connecting to the word line and the floating body 102, the junction capacitance $C_{SL}$ of the P-N junction between the source N$^+$ layer 103 connecting to the source line and the floating body 102, and the junction capacitance $C_{BL}$ of the P-N junction between the drain N$^+$ layer 104 connecting to the bit line and the floating body 102, and is represented as follows.

$$C_{FB}=C_{WL}+C_{BL}+C_{SL} \qquad (1)$$

Thus, when the voltage $V_{WL}$ of the word line oscillates during writing, the voltage of the floating body 102 as a storage node (i.e., a node) of the memory cell is also influenced. FIG. 8B illustrates such a state. When the voltage $V_{WL}$ of the word line rises from 0 V to $V_{ProgWL}$ during writing, the voltage $V_{FB}$ of the floating body 102 rises from the voltage $V_{FB1}$ in the initial state before the voltage of the word line has changed to $V_{FB2}$ due to capacitive coupling with the word line. The amount of change in the voltage $\Delta V_{FB}$ is represented as follows.

$$\Delta V_{FB} = V_{FB2} - V_{FB1}$$

$$= C_{WL}/(C_{WL} + C_{BL} + C_{SL}) \times V_{ProgWL} \quad (2)$$

Herein, β, which is referred to as a coupling ratio, is represented as follows.

$$\beta = C_{WL}/(C_{WL} + C_{BL} + C_{SL}) \quad (3)$$

In such a memory cell, the contribution rate of $C_{WL}$ is high, and, for example, $C_{WL}:C_{BL}:C_{SL}=8:1:1$. In such a case, β=0.8. When the voltage of the word line has changed from 5 V during writing to 0 V at the completion of the writing, for example, the floating body 102 receives oscillation noise with 5 V×β=4 V due to the capacitive coupling between the word line and the floating body 102. Therefore, there has been a problem in that a sufficient margin cannot be provided for the potential difference between the potentials of the floating body when "1" is written thereto and "0" is written thereto.

FIGS. 9A to 9C illustrate a read operation. Specifically, FIG. 9A illustrates a "1" written state and FIG. 9B illustrates a "0" written state. However, in practice, even when Vb has been written to the floating body 102 during writing of "1," the floating body 102 is negative-biased once the voltage of the word line returns to 0 V at the completion of the writing. When "0" is written, the floating body 102 is negative-biased further deeply. Thus, as illustrated in FIG. 9C, it would be impossible to provide a sufficient margin for the potential difference between when "1" is written and when "0" is written. Such a small operation margin has been a big problem with the present DRAM memory cell. In addition, it is also demanded to increase the density of such a DRAM memory cell.

CITATION LIST

Patent Literature

[Patent Literature 1]
Japanese Patent Laid-Open No. 2-188966
[Patent Literature 2]
Japanese Patent Laid-Open No. 3-171768
[Patent Literature 3] Japanese Patent No. 3957774

Non Patent Literature

[Non Patent Literature 1]
Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, Vol. 38, No. 3, pp. 573-578 (1991)
[Non Patent Literature 2]
H. Chung, H. Kim, H. Kim, K. Kim, S. Kim, K. Dong, J. Kim, Y. C. Oh, Y. Hwang, H. Hong, G. Jin, and C. Chung: "4F2 DRAM Cell with Vertical Pillar Transistor (VPT)," 2011 Proceeding of the European Solid-State Device Research Conference, (2011)

[Non Patent Literature 3]
H. S. Philip Wong, S. Raoux, S. Kim, Jiale Liang, J. R. Reifenberg, B. Rajendran, M. Asheghi and K. E. Goodson: "Phase Change Memory," Proceeding of IEEE, Vol. 98, No 12, December, pp. 2201-2227 (2010)
[Non Patent Literature 4]
T. Tsunoda, K. Kinoshita, H. Noshiro, Y. Yamazaki, T. Iizuka, Y. Ito, A. Takahashi, A. Okano, Y. Sato, T. Fukano, M. Aoki, and Y. Sugiyama: "Low Power and high Speed Switching of Ti-doped NiO ReRAM under the Unipolar Voltage Source of less than 3 V," IEDM (2007)
[Non Patent Literature 5]
W. Kang, L. Zhang, J. Klein, Y. Zhang, D. Ravelosona, and W. Zhao: "Reconfigurable Codesign of STT-MRAM Under Process Variations in Deeply Scaled Technology," IEEE Transaction on Electron Devices, pp. 1-9 (2015)
[Non Patent Literature 6]
M. G. Ertosum, K. Lim, C. Park, J. Oh, P. Kirsch, and K. C. Saraswat: "Novel Capacitorless Single-Transistor Charge-Trap DRAM (1T CT DRAM) Utilizing Electron," IEEE Electron Device Letter, Vol. 31, No. 5, pp. 405-407 (2010)
[Non Patent Literature 7]
J. Wan, L. Rojer, A. Zaslaysky, and S. Critoloveanu: "A Compact Capacitor-Less High-Speed DRAM Using Field Effect-Controlled Charge Regeneration," Electron Device Letters, Vol. 35, No. 2, pp. 179-181 (2012)
[Non Patent Literature 8]
T. Ohsawa, K. Fujita, T. Higashi, Y. Iwata, T. Kajiyama, Y. Asao, and K. Sunouchi: "Memory design using a one-transistor gain cell on SOI," IEEE JSSC, vol. 37, No. 11, pp 1510-1522 (2002).
[Non Patent Literature 9]
T. Shino, N. Kusunoki, T. Higashi, T. Ohsawa, K. Fujita, K. Hatsuda, N. Ikumi, F. Matsuoka, Y. Kajitani, R. Fukuda, Y. Watanabe, Y. Minami, A. Sakamoto, J. Nishimura, H. Nakajima, M. Morikado, K. Inoh, T. Hamamoto, A. Nitayama: "Floating Body RAM Technology and its Scalability to 32 nm Node and Beyond," IEEE IEDM (2006).
[Non Patent Literature 10]
E. Yoshida, T. Tanaka: "A Design of a Capacitorless 1T-DRAM Cell Using Gate-induced Drain Leakage (GIDL) Current for Low-power and High-speed Embedded Memory," IEEE IEDM (2003).
[Non Patent Literature 11]
J. Y. Song, W. Y. Choi, J. H. Park, J. D. Lee, and B-G. Park: "Design Optimization of Gate-All-Around (GAA) MOSFETs," IEEE Trans. Electron Devices, vol. 5, no. 3, pp. 186-191, May 2006.
[Non Patent Literature 12]
N. Loubet, et al.: "Stacked Nanosheet Gate-All-Around Transistor to Enable Scaling Beyond FinFET," 2017 IEEE Symposium on VLSI Technology Digest of Technical Papers, T17-5, T230-T231, June 2017.
[Non Patent Literature 13]
H. Jiang, N. Xu, B. Chen, L. Zengl, Y. He, G. Du, X. Liu and X. Zhang: "Experimental investigation of self-heating effect (SHE) in multiple-fin SOI FinFETs," Semicond. Sci. Technol. 29 (2014) 115021 (7pp).
[Non Patent Literature 14]
E. Yoshida, and T. Tanaka: "A Capacitorless 1T-DRAM Technology Using Gate-Induced Drain-Leakage (GIDL) Current for Low-Power and High-Speed Embedded Memory," IEEE Transactions on Electron Devices, Vol. 53, No. 4, pp. 692-697, April 2006.

SUMMARY OF INVENTION

Technical Problem

In a memory device using SGTs, each capacitorless single-transistor DRAM (i.e., a gain cell) involves strong capacitive coupling between a word line and a body of the SGT in a floating state, and thus has a problem in that when the potential of the word line is oscillated during data reading or data writing, the oscillation is directly transmitted as noise to the body of the SGT. Consequently, problems, such as erroneous reading and erroneous rewriting of memory data, occur, making it difficult to put the capacitorless single-transistor DRAM (i.e., the gain cell) into practical use. In addition to solving such problems, it is also necessary to increase the density of the DRAM memory cell.

Solution to Problem

To solve the aforementioned problems, a memory device according to the present invention includes a semiconductor base material provided on a substrate in a manner standing in an upright position along a vertical direction or extending in a horizontal direction with respect to the substrate;

a first impurity layer and a second impurity layer having the same conductivity type and continuous with opposite ends of the semiconductor base material;

a first gate insulating layer partially or entirely surrounding a side face of the semiconductor base material on a side of the first impurity layer;

a second gate insulating layer continuous with the first gate insulating layer, and partially or entirely surrounding the side face of the semiconductor base material on a side of the second impurity layer;

a first gate conductor layer covering the first gate insulating layer;

a second gate conductor layer covering the second gate insulating layer; and a third impurity layer provided between one or each of the first impurity layer and the second impurity layer and the semiconductor base material, the third impurity layer being provided in, in a central axis direction of the semiconductor base material, one or each of a region between the first gate conductor layer and the first impurity layer and a region between the second gate conductor layer and the second impurity layer, the third impurity layer having the same conductivity type as the first impurity layer and the second impurity layer, and being in contact with one or each of the first impurity layer and the second impurity layer, in which:

each of a memory write operation, a memory read operation, and a memory erase operation is performed by controlling a voltage applied to each of the first impurity layer, the second impurity layer, the first gate conductor layer, and the second gate conductor layer (first invention).

In the aforementioned first invention, a concentration of impurities in the third impurity layer is lower than a concentration of impurities in each of the first impurity layer and the second impurity layer and is higher than a concentration of impurities in the semiconductor base material (second invention).

In the aforementioned first invention, the third impurity layer is formed at a position continuous with the second impurity layer (third invention).

In the aforementioned first invention, the third impurity layer is formed at a position continuous with the first impurity layer (fourth invention).

In the aforementioned first invention, the third impurity layer is formed at each of a position continuous with the first impurity layer and a position continuous with the second impurity layer (fifth invention).

In the aforementioned first invention, a first gate capacitance between the first gate conductor layer and the semiconductor base material is larger than a second gate capacitance between the second gate conductor layer and the semiconductor base material (sixth invention).

The third impurity layer extends to an end portion of the semiconductor base material and to an outer peripheral portion continuous with the end portion (seventh invention).

In the aforementioned seventh invention, the semiconductor base material stands in an upright position along the vertical direction with respect to the substrate, and the first impurity layer and the third impurity layer continuous with the semiconductor base material extend to an outer side of the semiconductor base material as seen in plan view (eighth invention).

In the aforementioned first invention, the memory write operation is performed by controlling a voltage applied to each of the first impurity layer, the second impurity layer, the first gate conductor layer, and the second gate conductor layer to perform an operation of generating electrons and holes in the semiconductor base material through an impact ionization phenomenon based on a current flowed between the first impurity layer and the second impurity layer or using a gate induced drain leakage current, to perform an operation of removing, from among the generated electrons and holes, the electrons or the holes that are minority carriers in the semiconductor base material, and to perform an operation of causing the electrons or the holes that are majority carriers in the semiconductor base material to partially or entirely remain in the semiconductor base material, and the memory erase operation is performed by controlling a voltage applied to each of the first impurity layer, the second impurity layer, the first gate conductor layer, and the first gate conductor layer to remove from the semiconductor base material the electrons or the holes that are the majority carriers remaining in the semiconductor base material (ninth invention).

BRIEF DESCRIPTION OF DRAWINGS

FIGS. 2A, 2B and 2C are views for illustrating the mechanism of an erase operation for the memory device including the SGTs according to the first embodiment.

FIGS. 3A, 3B and 3C are views for illustrating the mechanism of a write operation for the memory device including the SGTs according to the first embodiment.

FIGS. 5AA, 5AB and 5AC are views for illustrating a method for producing the memory device including the SGTs according to the first embodiment.

FIGS. 5BA, 5BB and 5BC are views for illustrating a method for producing the memory device including the SGTs according to the first embodiment.

FIGS. 5FA, 5FB, 5FC and 5FD are views for illustrating a method for producing the memory device including the SGTs according to the first embodiment.

FIGS. 5GA, 5GB, 5GC and 5GD are views for illustrating a method for producing the memory device including the SGTs according to the first embodiment.

FIGS. 5HA, 5HB and 5HC are views for illustrating a method for producing the memory device including the SGTs according to the first embodiment.

FIGS. 9A, 9B and 9C are views for illustrating a read operation for the conventional capacitorless DRAM memory cell.

MODE FOR CARRYING OUT THE INVENTION

Hereinafter, the structure, a driving scheme, and a production method for a memory device using semiconductor elements (hereinafter referred to as dynamic flash memory) according to the present invention will be described with reference to the drawings.

First Embodiment

The structure, the operation mechanism, and a production method for a dynamic flash memory cell according to a first embodiment of the present invention will be described with reference to FIGS. 1 to 5HA-5HC. The structure of the dynamic flash memory cell will be described with reference to FIG. 1. Then, a data erasing mechanism will be described with reference to FIGS. 2A to 2C, a data writing mechanism will be described with reference to FIGS. 3A to 3C, and a data reading mechanism will be described with reference to FIGS. 4AA to 4AC. Then, a method for producing the dynamic flash memory will be described with reference to FIGS. 5AA to 5HC.

Figure 1:
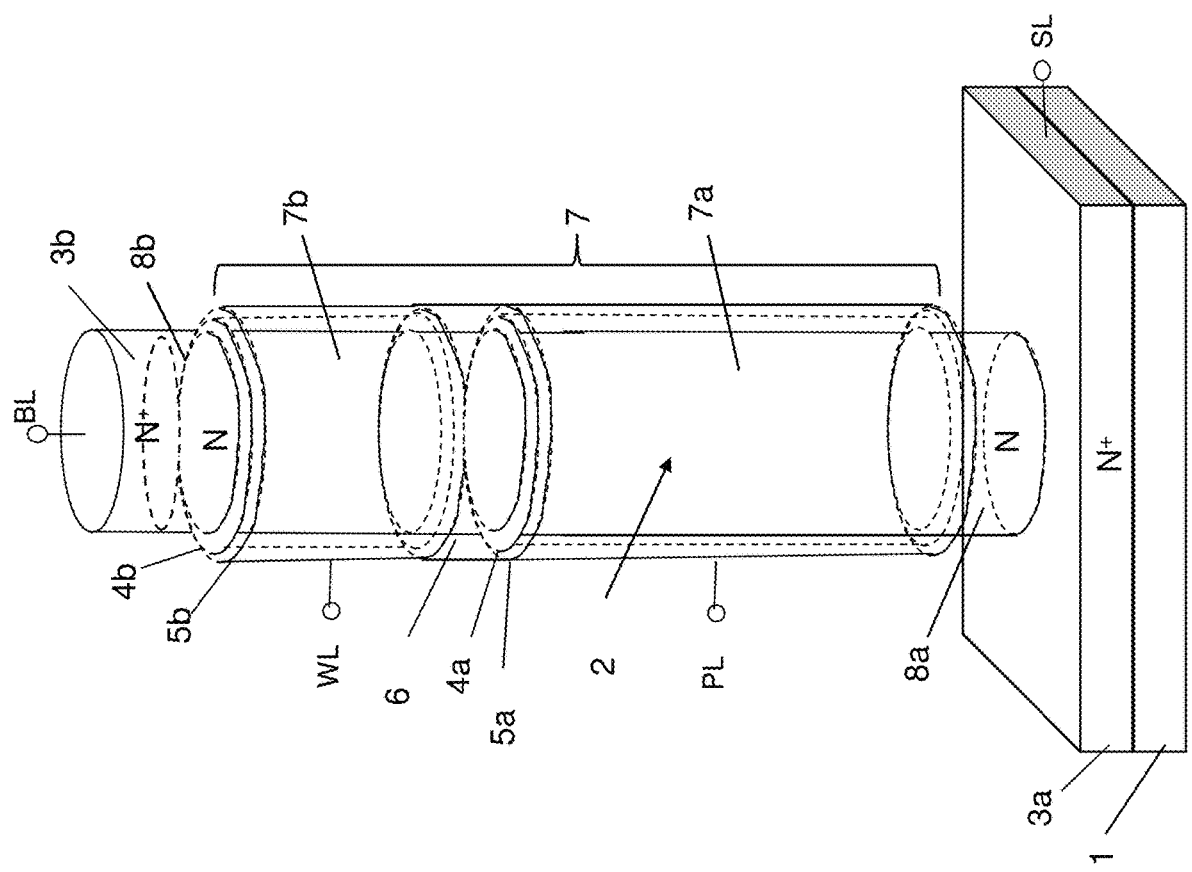
FIG. 1 is a view illustrating the structure of a memory device including SGTs according to a first embodiment.

FIG. 1 illustrates the structure of the dynamic flash memory cell according to the first embodiment of the present invention. An $N^+$ layer $3a$ (which is an example of a "first impurity layer" in the claims) is provided on a substrate 1 (which is an example of a "substrate" in the claims). A silicon semiconductor pillar 2 with p-type or i-type (intrinsic) conductivity containing acceptor impurities (which is an example of a "semiconductor base material" in the claims) (hereinafter, the silicon semiconductor pillar shall be referred to as a "Si pillar") is provided on the $N^+$ layer $3a$. An N layer $8a$ (which is an example of a "third impurity layer" in the claims) is provided at the bottom of the Si pillar 2, and an N layer $8b$ (which is an example of the "third impurity layer" in the claims) is provided at the top of the Si pillar 2. An $N^+$ layer $3b$ (which is an example of a "second impurity layer" in the claims) is provided on the N layer $8b$. The concentration of donor impurities in each of the N layers $8a$ and $8b$ is lower than that in each of the $N^+$ layers $3a$ and $3b$. A portion of the Si pillar 2 between the N layers $8a$ and $8b$ is a channel region 7. A first gate insulating layer $4a$ (which is an example of a "first gate insulating layer" in the claims) and a second gate insulating layer $4b$ (which is an example of a "second gate insulating layer" in the claims) are provided in this order from the lower side so as to surround the channel region 7. The first gate insulating layer $4a$ and the second gate insulating layer $4b$ are respectively in contact with or located in proximity to the N layers $8a$ and $8b$. A first gate conductor layer $5a$ (which is an example of a "first gate conductor layer" in the claims) is provided so as to surround the first gate insulating layer $4a$, and a second gate conductor layer $5b$ (which is an example of a "second gate conductor layer" in the claims) is provided so as to surround the second gate insulating layer $4b$. The first gate conductor layer $5a$ and the second gate conductor layer $5b$ are separated by an insulating layer 6. The channel region 7, which is the portion of the Si pillar 2 between the N layers $8a$ and $8b$, includes a first channel region $7a$ surrounded by the first gate insulating layer $4a$ and a second channel region $7b$ surrounded by the second gate insulating layer $4b$. Accordingly, a dynamic flash memory cell is formed that includes the $N^+$ layers $3a$ and $3b$, the N layers $8a$ and $8b$, the channel region 7, the first gate insulating layer $4a$, the second gate insulating layer $4b$, the first gate conductor layer $5a$, and the second gate conductor layer $5b$. The $N^+$ layer $3a$ connects to a source line SL (which is an example of a "source line" in the claims), the $N^+$ layer $3b$ connects to a bit line BL (which is an example of a "bit line" in the claims), the first gate conductor layer $5a$ connects to a plate line PL (which is an example of a "first drive control line" in the claims), and the second gate conductor layer $5b$ connects to a word line WL (which is an example of a "word line" in the claims). The N layers $8a$ and $8b$ respectively suppress the flow of unwanted electrons into the channel region 7 from the $N^+$ layer $3a$ connecting to the source line SL and the $N^+$ layer $3b$ connecting to the bit line BL in the dynamic flash memory due to the voltage applied to each of the source line SL, the plate line PL, the word line WL, and the bit line BL. The dynamic flash memory cell desirably has such a structure that the gate capacitance of the first gate conductor layer $5a$ connecting to the plate line PL is larger than the gate capacitance of the second gate conductor layer $5b$ connecting to the word line WL. In the memory device, the aforementioned plurality of dynamic flash memory cells are two-dimensionally arranged on the substrate 1.

It should be noted that in FIG. 1, the gate length of the first gate conductor layer $5a$ is set longer than the gate length of the second gate conductor layer $5b$ such that the gate capacitance of the first gate conductor layer $5a$ connected to the plate line PL becomes larger than the gate capacitance of the second gate conductor layer $5b$ connected to the word line WL. However, it is also possible to, without setting the gate length of the first gate conductor layer $5a$ to be longer than the gate length of the second gate conductor layer $5b$, make the thickness of the gate insulating film for the first gate insulating layer $4a$ to be thinner than the thickness of the gate insulating film for the second gate insulating layer 4b. Alternatively, it is also possible to set the dielectric constant of the first gate insulating layer 4a to be higher than the dielectric constant of the second gate insulating layer 4b. As a further alternative, it is also possible to combine any of the lengths of the gate conductor layers 5a and 5b and the thicknesses and dielectric constants of the gate insulating layers 4a and 4b so that the gate capacitance of the first gate conductor layer 5a becomes larger than the gate capacitance of the second gate conductor layer 5b.

The position of the upper end of the N layer 8a in the vertical direction may be located either above or below the position of the lower end of the first gate conductor layer 5a. Similarly, the position of the lower end of the N layer 8b may be located either above or below the position of the upper end of the second gate conductor layer 5b.

The first gate conductor layer 5a may be split into two or more conductor layers, and the resulting two or more conductor layers may be operated synchronously or asynchronously as conductor electrodes for the plate line. Similarly, the second gate conductor layer 5b may be split into two or more conductor layers, and the resulting two or more conductor layers may be operated synchronously or asynchronously as conductor electrodes for the word line. Even with such a structure, the dynamic flash memory operation can be performed.

The dynamic flash memory operation can also be performed with a structure obtained by reversing the polarity of the conductivity of each of the N$^+$ layers 3a and 3b, the N layers 8a and 8b, and the p-type Si pillar 2. In such a case, the majority carriers in the n-type Si pillar are electrons. Thus, electrons generated through impact ionization are stored in the channel region 7, and the channel region 7 is thus set to the state "1."

FIGS. 2A to 2C illustrate the mechanism of an erase operation. The channel region 7 between the N layers 8a and 8b is electrically isolated from the substrate, and functions as a floating body. FIG. 2A illustrates a state in which holes 11 generated through impact ionization in a previous cycle are stored in the channel region 7 before the erase operation is started. As illustrated in FIG. 2B, during the erase operation, the voltage of the source line SL is set to a negative voltage $V_{ERA}$. Herein $V_{ERA}$ is $-3$ V, for example. Consequently, the P-N junction between the N$^+$ layer 3a serving as a source connecting to the source line SL and the N layer 8a and the channel region 7 is forward-biased regardless of the value of the initial potential of the channel region 7. Thus, the holes 11 generated through impact ionization in the previous cycle and stored in the channel region 7 are sucked into the N$^+$ layer 3a serving as the source portion and the N layer 8a, and then, the potential $V_{FB}$ of the channel region 7 becomes $V_{FB}=V_{ERA}+Vb$. Herein, Vb is the built-in voltage of the P-N junction, and is about 0.7 V. Thus, when $V_{ERA}=-3$ V, the potential of the channel region 7 becomes $-2.3$ V. Such a value corresponds to the potential level of the channel region 7 in the erase state. Therefore, when the potential of the channel region 7 functioning as the floating body becomes a negative voltage, the threshold voltage of the N-channel MOS transistor in the dynamic flash memory cell becomes high due to the substrate bias effect. Accordingly, as illustrated in FIG. 2C, the threshold voltage of the second gate conductor layer 5b connecting to the word line WL becomes high. Such an erase state of the channel region 7 corresponds to logical memory data "0." It should be noted that in reading data, setting the voltage applied to the first gate conductor layer 5a connecting to the plate line PL to be higher than the threshold voltage corresponding to the logical memory data "1" and lower than the threshold voltage corresponding to the logical memory data "0" can obtain such characteristics that no current flows even when the voltage of the word line WL is set high for reading the logical memory data "0" as illustrated in FIG. 2C. The aforementioned conditions of the voltages applied to the bit line BL, the source line SL, the word line WL, and the plate line PL are only examples for performing an erase operation. Thus, other operating conditions may also be employed as long as an erase operation can be performed. For example, an erase operation may be performed by providing a voltage difference between the bit line BL and the source line SL.

FIGS. 3A to 3C illustrate a write operation for the dynamic flash memory cell according to the first embodiment of the present invention. As illustrated in FIG. 3A, 0 V, for example, is input to the N$^+$ layer 3a connecting to the source line SL, 3 V, for example, is input to the N$^+$ layer 3b connecting to the bit line BL, 2 V, for example, is input to the first gate conductor layer 5a connecting to the plate line PL, and 5 V, for example, is input to the second gate conductor layer 5b connecting to the word line WL. Consequently, as illustrated in FIG. 3A, an annular inversion layer 12a is formed in the first channel region 7a on the inner side of the first gate conductor layer 5a connecting to the plate line PL, and a first N-channel MOS transistor region including the channel region 7a surrounded by the first gate conductor layer 5a (see FIG. 1) is operated in the saturation region. Thus, the inversion layer 12a on the inner side of the first gate conductor layer 5a connecting to the plate line PL has a pinch-off point 13. Meanwhile, a second N-channel MOS transistor region including the channel region 7b surrounded by the second gate conductor layer 5b connecting to the word line WL (see FIG. 1) is operated in the linear region. Thus, the second channel region 7b on the inner side of the second gate conductor layer 5b connecting to the word line WL has no pinch-off point, and an inversion layer 12b is formed on the entire surface. The inversion layer 12b formed on the entire surface on the inner side of the second gate conductor layer 5b connecting to the word line WL functions as a substantial drain of the second N-channel MOS transistor region including the second gate conductor layer 5b. Thus, an electric field in a first boundary region of the channel region 7 between the first N-channel MOS transistor region including the first gate conductor layer 5a and the second N-channel MOS transistor region including the second gate conductor layer 5b, which are connected in series, becomes maximum, and an impact ionization phenomenon occurs in the region. Such a region is a region on the source side as seen from the second N-channel MOS transistor region including the second gate conductor layer 5b connecting to the word line WL. Thus, such a phenomenon is called a source-side impact ionization phenomenon. Due to the source-side impact ionization phenomenon, electrons flow from the N$^+$ layer 3a connecting to the source line SL and the N layer 8a to the N$^+$ layer 3b connecting to the bit line BL and the N layer 8b. The accelerated electrons collide with Si lattice atoms, and electron-hole pairs are generated due to the kinetic energy. Some of the generated electrons flow into the first gate conductor layer 5a and the second gate conductor layer 5b, but most of them flow into the N$^+$ layer 3b connecting to the bit line BL. To write "1," it is also possible to generate electron-hole pairs using a gate induced drain leakage (GIDL) current, and then fill the floating body FB with the generated holes (see Non Patent Literature 14). It should be noted that it is also possible to generate electron-hole pairs through an impact ionization phenomenon at the boundary between the N layer 8a and the channel region 7 or the boundary between the N layer 8b and the channel region 7.

As illustrated in FIG. 3B, the generated holes 11 are the majority carriers in the channel region 7, and charge the channel region 7 in a positively biased manner. Since the N+ layer 3a connecting to the source line SL is at 0 V, the channel region 7 is charged up to the built-in voltage Vb (about 0.7 V) of the P-N junction between the N+ layer 3a connecting to the source line SL and the N layer 8a and the channel region 7. When the channel region 7 is charged in a positively biased manner, the threshold voltage of each of the first N-channel MOS transistor region and the second N-channel MOS transistor region becomes low due to the substrate bias effect. Accordingly, as illustrated in FIG. 3C, the threshold voltage of the N-channel MOS transistor in the second channel region 7b connecting to the word line WL becomes low. Such a written state of the channel region 7 is allocated as logical memory data "1."

It should be noted that during the write operation, it is also possible to generate electron-hole pairs through an impact ionization phenomenon or using a GIDL current not in the aforementioned first boundary region but in a second boundary region between the N layer 8a and the first channel semiconductor layer 7a or a third boundary region between the N layer 8b and the second channel semiconductor layer 7b, and then charge the channel region 7 with the generated holes 11. It should be also noted that the aforementioned conditions of the voltages applied to the bit line BL, the source line SL, the word line WL, and the plate line PL are only examples for performing a write operation. Thus, other operating conditions may also be employed as long as a write operation can be performed.

Figure 4A:
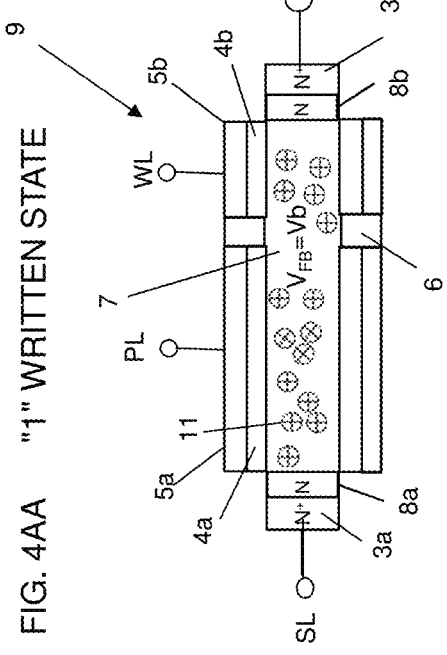
FIGS. 4AA, 4AB and 4AC are views for illustrating the mechanism of a read operation for the memory device including the SGTs according to the first embodiment.
Figure 4A:
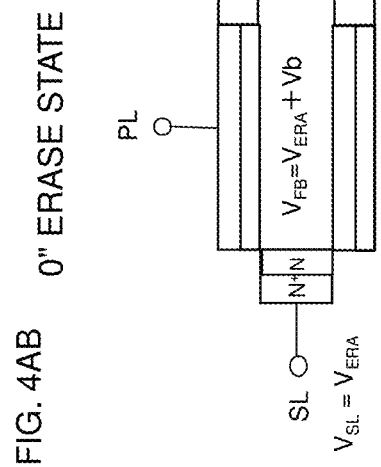
Figure 4A:
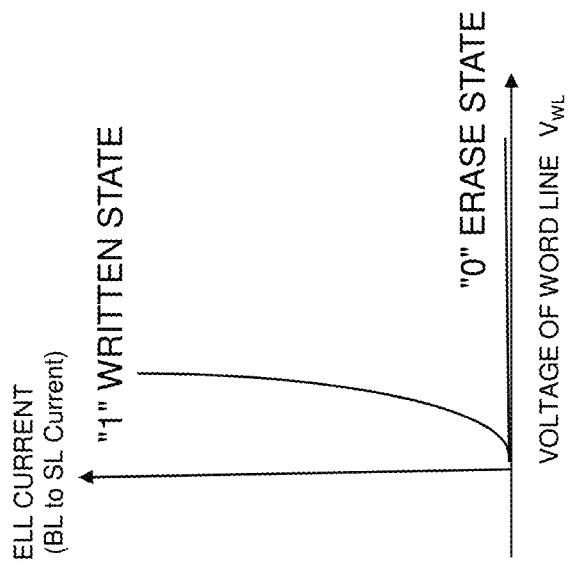

A read operation for the dynamic flash memory cell according to the first embodiment of the present invention will be described with reference to FIGS. 4AA-4AC to 4BA-4BD. A read operation for the dynamic flash memory cell will be described with reference to FIGS. 4AA to 4AC. As illustrated in FIG. 4AA, when the channel region 7 is charged up to the built-in voltage Vb (about 0.7 V), the threshold voltage of the N-channel MOS transistor drops due to the substrate bias effect. Such a state is allocated as the logical memory data "1." As illustrated in FIG. 4AB, in a memory block selected before a write operation is performed, the floating voltage $V_{FB}$ of the channel region 7, which has been set to the erase state "0" in advance, is $V_{ERA}$+Vb. Through a write operation, the written state "1" is randomly stored. Consequently, logical memory data at logic levels "0" and "1" are created for the word line WL. As illustrated in FIG. 4AC, reading is performed with a sense amplifier by utilizing the difference in level between the two threshold voltages for the word line WL. It should be noted that in reading data, setting the voltage applied to the first gate conductor layer 5a connecting to the plate line PL to be higher than the threshold voltage corresponding to the logical memory data "1" and lower than the threshold voltage corresponding to the logical memory data "0" can obtain such characteristics that no current flows even when the voltage of the word line WL is set high for reading the logical memory data "0" as illustrated in FIG. 4AC.

Figure 4B:
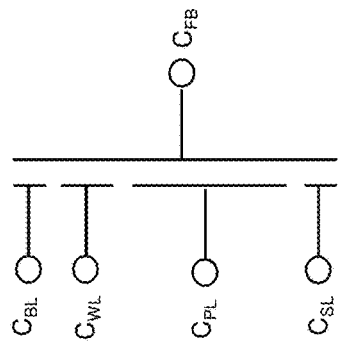
FIGS. 4BA, 4BB, 4BC and 4BD are views for illustrating the mechanism of a read operation for the memory device including the SGTs according to the first embodiment.
Figure 4B:
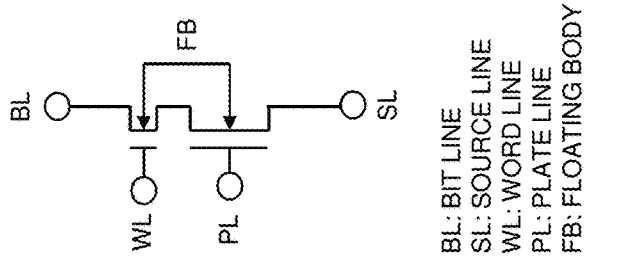
Figure 4B:
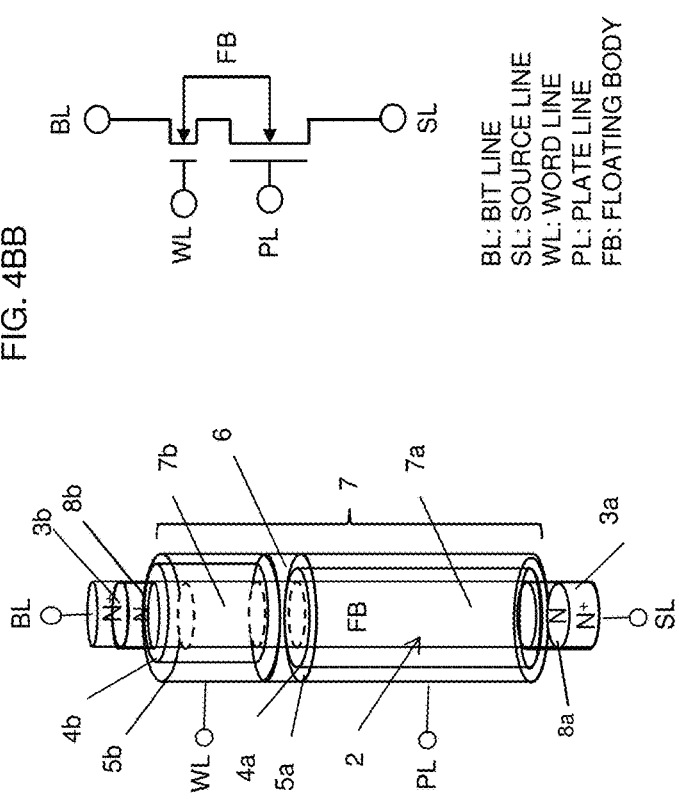
Figure 4B:
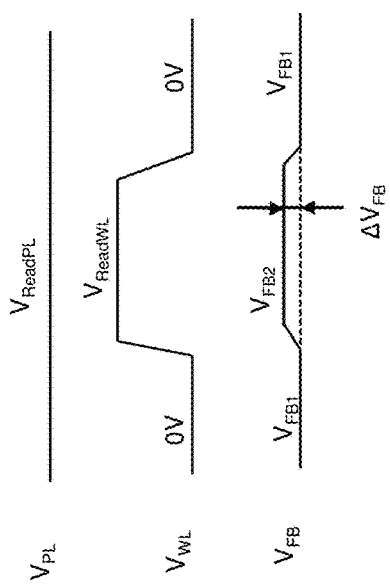

The magnitude relationship between the gate capacitances of the first gate conductor layer 5a and the second gate conductor layer 5b during a read operation for the dynamic flash memory cell according to the first embodiment of the present invention, and an operation related thereto will be described with reference to FIGS. 4BA to 4BD. It is desirable that the gate capacitance of the second gate conductor layer 5b connecting to the word line WL be designed to be smaller than the gate capacitance of the first gate conductor layer 5a connecting to the plate line PL. As illustrated in FIG. 4BA, the length in the central axis direction of the first gate conductor layer 5a connecting to the plate line PL is set longer than the length in the central axis direction of the second gate conductor layer 5b connecting to the word line WL so that the gate capacitance of the second gate conductor layer 5b connecting to the word line WL becomes smaller than the gate capacitance of the first gate conductor layer 5a connecting to the plate line PL. FIG. 4BB illustrates an equivalent circuit of a single cell of the dynamic flash memory in FIG. 4BA. In addition, FIG. 4BC illustrates the relationship among the coupled capacitances of the dynamic flash memory. Herein, $C_{WL}$, represents the capacitance of the second gate conductor layer 5b, $C_{PL}$ represents the capacitance of the first gate conductor layer 5a, $C_{BL}$ represents the capacitance of the P-N junction between the N+ layer 3b and the N layer 8b serving as the drain and the second channel region 7b, and $C_{SL}$ represents the capacitance of the P-N junction between the N+ layer 3a and the N layer 8a serving as the source and the first channel region 7a. As illustrated in FIG. 4BD, when the voltage of the word line WL oscillates, the operation has influence as noise on the channel region 7. Potential fluctuation $\Delta V_{FB}$ of the channel region 7 at this time is represented as follows.

$$\Delta V_{FB}=C_{WL}/(C_{PL}+C_{WL}+C_{BL}+C_{SL})\times V_{ReadWL} \qquad (1)$$

Herein, $V_{ReadWL}$ is the oscillating potential of the word line WL during reading. As is obvious from Expression (1), $\Delta V_{FB}$ can be made small by setting the contribution rate of $C_{WL}$ low in comparison with the entire capacitance $C_{BL}$+$C_{WL}$+$C_{BL}$+$C_{BL}$ of the channel region 7. $C_{BL}$+$C_{SL}$ is the capacitance of the P-N junctions. To increase such capacitance, for example, the diameter of the Si pillar 2 is increased, which is, however, undesirable for downsizing the memory cell. In contrast, it is also possible to further reduce $\Delta V_{FB}$ by setting the length in the central axis direction of the first gate conductor layer 5a connecting to the plate line PL to be further longer than the length in the central axis direction of the second gate conductor layer 5b connecting to the word line WL, without decreasing the degree of integration of the memory cell as seen in plan view. It should be noted that the aforementioned conditions of the voltages applied to the bit line BL, the source line SL, the word line WL, and the plate line PL are only examples for performing a read operation. Thus, other operating conditions may also be employed as long as a read operation can be performed. Such read operation may also be performed through a bipolar operation A method for producing the dynamic flash memory of the present embodiment will be illustrated with reference to FIGS. 5AA-5AC to 5HA-5HC. In each drawing, (A) illustrates a plan view, (B) illustrates a cross-sectional view along line X-X' in (A), (C) illustrates a cross-sectional view along line Y-Y' in (A), and (D) in each of FIGS. 5FA to 5FD and 5GA to 5GD illustrates a cross-sectional view along line X1-X1'. It should be noted that in the actual memory device, more than four dynamic flash memory cells are arranged in a matrix on a substrate 20.

As illustrated in FIGS. 5AA to 5AC, an N+ layer 21, an N layer 25A, a P layer 22 of Si, an N layer 25B, and an N+ layer 23 are formed in this order from the lower side on a substrate 20. In addition, mask material layers 24a, 24b, 24c, and 24d, which are circular in shape as seen in plan view, are formed. It should be noted that the substrate 20 may be formed using SOI (Silicon On Insulator), single-layer or multi-layer Si, or other semiconductor materials. Alternatively, the substrate 20 may be a well layer including a single N layer, a single P layer, multiple N layers, or multiple P layers. It should be noted that the concentration of donor impurities in each of the N layers 25A and 25B is lower than that in each of the N$^+$ layers 21 and 23 and is higher than the concentration of acceptor impurities in the P layer.

Next, as illustrated in FIGS. 5BA to 5BC, the N$^+$ layer 23, the N layer 25B, the P layer 22, and the upper portion of the N layer 25A are etched using the mask material layers 24a to 24d as masks so that an N layer 25a, Si pillars 22a, 22b, 22c, and 22d (not illustrated), N layers 25ba, 25bb, 25bc, and 25bd (not illustrated), and N$^+$ layers 23a, 23b, 23c, and 23d (not illustrated) are formed on the N$^+$ layer 21. It should be noted that in the aforementioned etching, the bottoms of the outer peripheries of the Si pillars 22a to 22d may be located in the N$^+$ layer 21.

Figure 5C:
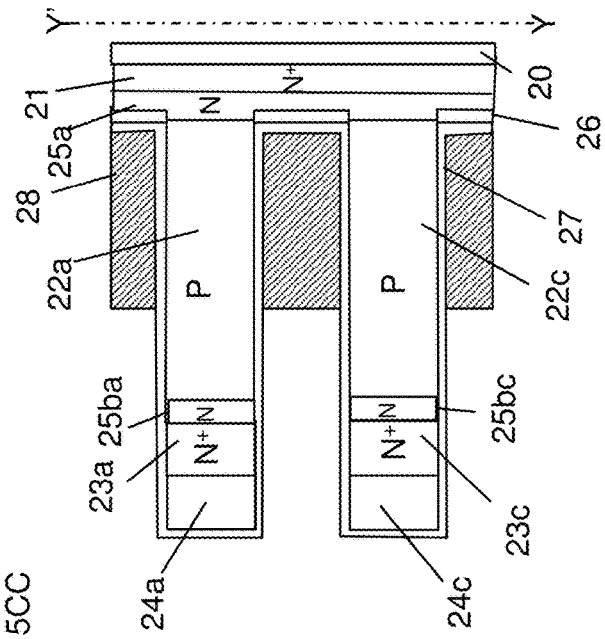
FIGS. 5CA, 5CB and 5CC are views for illustrating a method for producing the memory device including the SGTs according to the first embodiment.
Figure 5C:
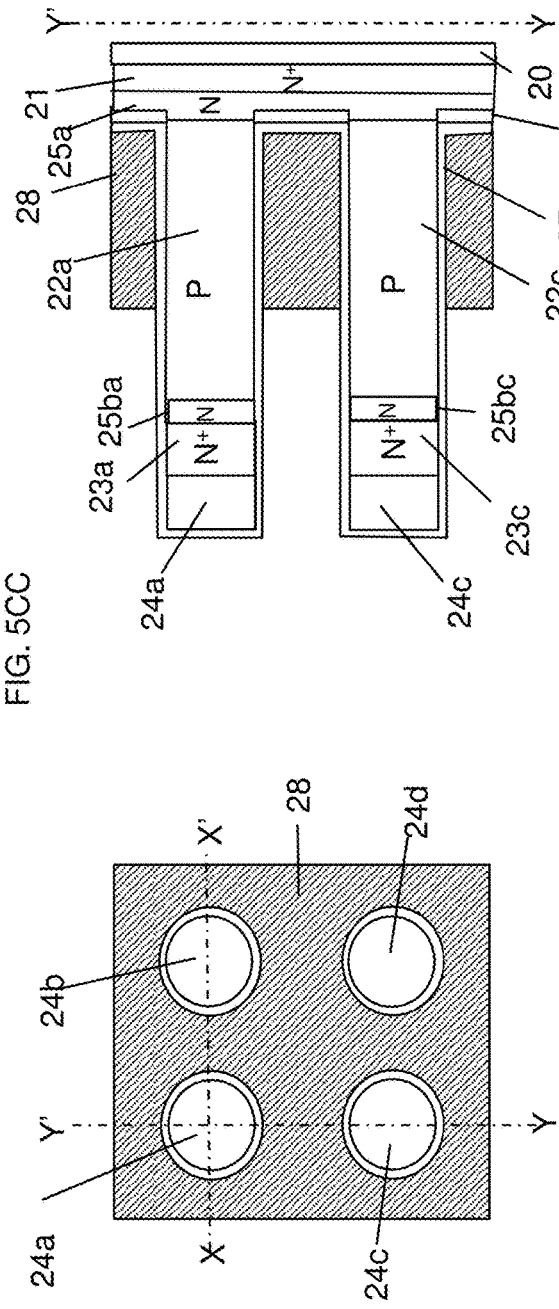
Figure 5C:
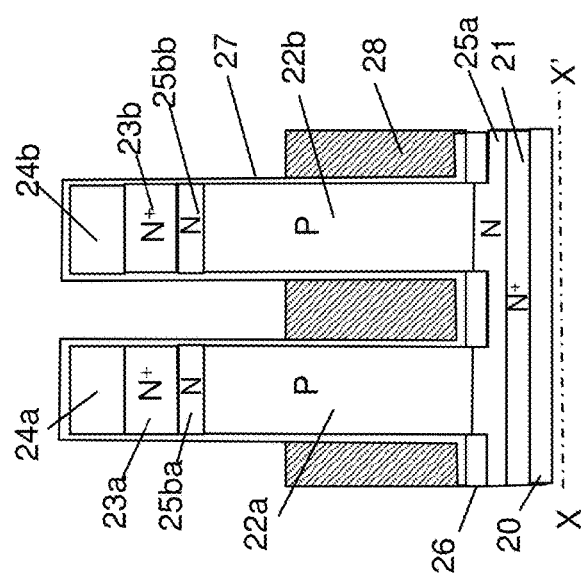

Next, as illustrated in FIGS. 5CA to 5CC, a SiO$_2$ layer 26 is formed on the N layer 25a on the outer peripheries of the Si pillars 22a to 22d. Then, a gate insulating layer HfO$_2$ layer 27 is formed covering the entire surface, using ALD (Atomic Layer Deposition), for example. Then, a TiN layer (not illustrated) to serve as a gate conductor layer is formed covering the entire surface. Then, the TiN layer is polished through CMP (Chemical Mechanical Polishing) so that its upper surface position is located at the level of the upper surfaces of the mask material layers 24a to 24d. Then, the TiN layer is etched through RIE (Reactive Ion Etching) so that its upper surface position in the vertical direction is located closer to the upper portions of the Si pillars 22a to 22d than to the intermediate positions thereof, whereby a TiN layer 28 is formed. It should be noted that the HfO$_2$ layer 27 may be other insulating layers including a single layer or multiple layers as long as such an insulating layer functions as a gate insulating layer. In addition, as the TiN layer 28, other conductor layers including a single layer or multiple layers may be used as long as such a conductor layer has the function of a gate conductor layer.

Figure 5D:
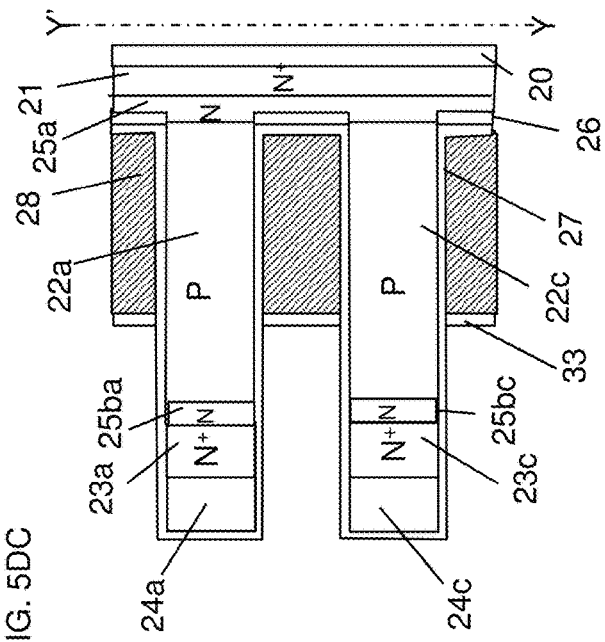
FIGS. 5DA, 5DB and 5DC are views for illustrating a method for producing the memory device including the SGTs according to the first embodiment.
Figure 5D:
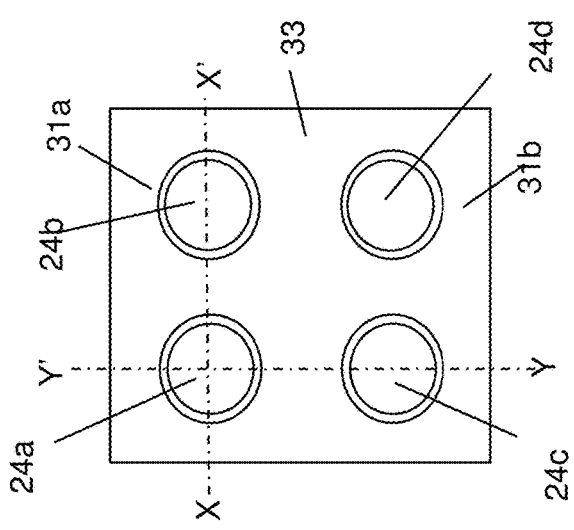
Figure 5D:
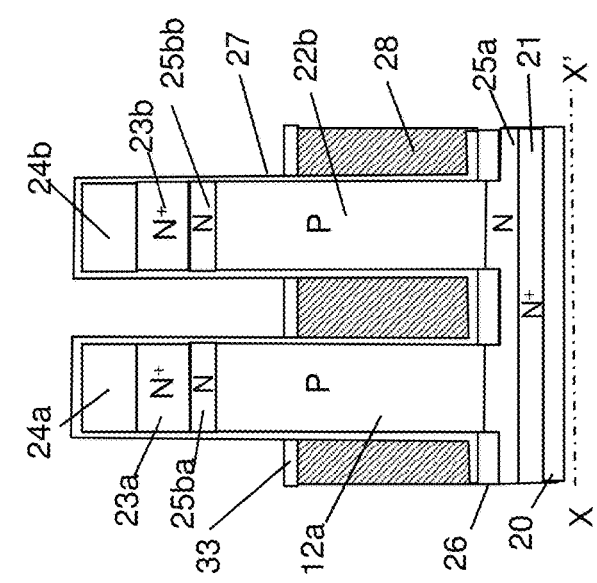

Next, as illustrated in FIGS. 5DA to 5DC, a SiO$_2$ layer 33 is formed on the TiN layer 28.

Figure 5E:
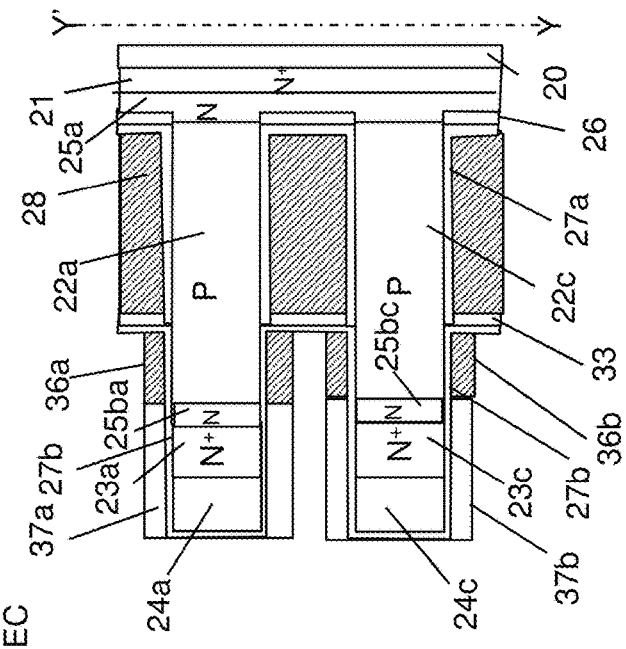
FIGS. 5EA, 5EB and 5EC are views for illustrating a method for producing the memory device including the SGTs according to the first embodiment.
Figure 5E:
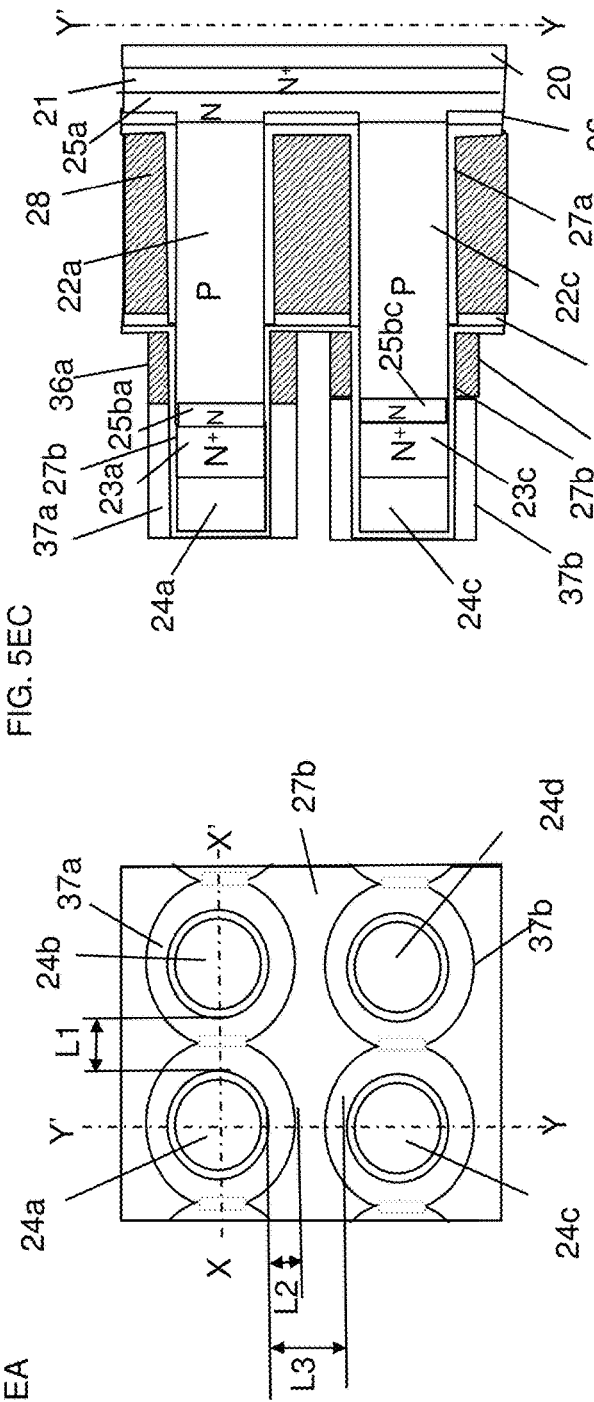
Figure 5E:
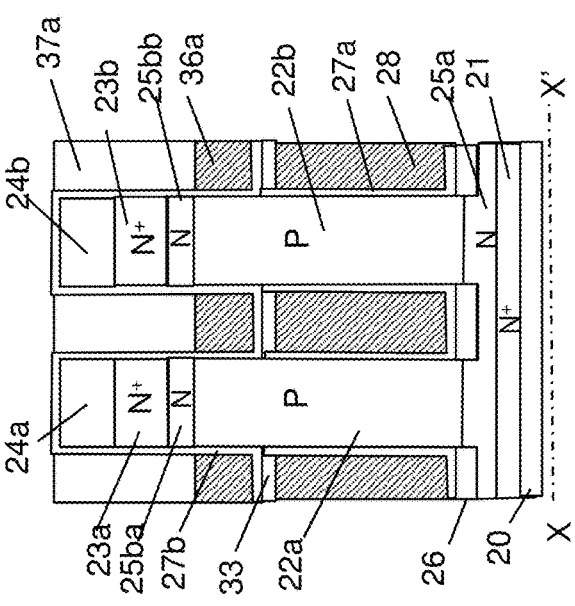

Next, as illustrated in FIGS. 5EA to 5EC, a portion of the HfO$_2$ layer 27 at a level above the SiO$_2$ layer 33 is etched so that a HfO$_2$ layer 27a is formed. Then, a HfO$_2$ layer 27b is formed on the entire surface. Then, a TiN layer (not illustrated) is formed covering the entire surface using the CVD method. Then, the TiN layer is polished using the CMP method so that its upper surface position is located at the level of the upper surfaces of the mask material layers 24a to 24d. Then, the TiN layer is etched using the RIE method so that its upper surface position is located at a level around the lower ends of the N layers 25ba to 25bd. Then, a SiN layer 37a, which surrounds the side faces of the N layers 25ba and 25bb, the N$^+$ layers 23a and 23b, and the mask material layers 24a and 24b and is continuous, is formed. Similarly, a SiN layer 37b, which surrounds the side faces of the N layers 25bc and 25bd, the N$^+$ layers 23c and 23d, and the mask material layers 24c and 24d and is continuous, is formed. Then, the TiN layer is etched using the SiN layers 37a and 37b as masks so that TiN layers 36a and 36b are formed. Herein, the distance L1 between two intersections between line X-X' and the outer circumferential lines of the HfO$_2$ layer 27b surrounding the Si pillars 22a and 22b is set shorter than twice the width L2 of each of the SiN layers 37a and 37b along line Y-Y', and the distance L3 between two intersections between line Y-Y' and the outer circumferential lines of the HfO$_2$ layer 27b surrounding the Si pillars 22a and 22c is set longer than twice the width L2. Accordingly, the SiN layer 37a can be formed such that it is continuous around the Si pillars 22a and 22b and is separated from the SiN layer 37b. Similarly, the SiN layer 37b is formed such that it is continuous around the Si pillars 22c and 22d and is separated from the SiN layer 37a.

Next, as illustrated in FIGS. 5FA to 5FD, a SiO$_2$ layer 39 is formed that includes voids 41aa, 41ab, 41ac, 41ba, 41bb, 41bc, 41ca, 41cb, and 41cc between the side faces of and around the TiN layers 36a and 36b and the SiN layers 37a and 37b. It should be noted that the voids 41aa, 41ab, 41ac, 41ba, 41bb, 41bc, 41ca, 41cb, and 41cc are formed such that their upper end positions are located at a level lower than the upper end positions of the TiN layers 36a and 36b indicated by the dotted line in FIG. 5FD.

Next, as illustrated in FIGS. 5GA to 5GD, the mask material layers 24a to 24d are etched so that contact holes 40a, 40b, 40c, and 40d are formed.

Next, as illustrated in FIGS. 5HA to 5HC, a conductor layer 42a of a bit line BL1 is formed that connects to the N$^+$ layers 23a and 23c via the contact holes 40a and 40c, respectively, and also, a conductor layer 42b of a bit line BL2 is formed that connects to the N$^+$ layers 23b and 23d via the contact holes 40b and 40d, respectively. Then, a SiO$_2$ layer 43 is formed that includes voids 44a, 44b, and 44c between and on the opposite sides of the conductor layer 42a of the bit line BL1 and the conductor layer 42b of the bit line BL2. Accordingly, dynamic flash memory is formed on the substrate 20. The TiN layers 36a and 36b respectively serve as conductor layers of word lines WL1 and WL2. The TiN layer 28 serves as a conductor layer of the plate line PL that also serves as a gate conductor layer. The N$^+$ layer 21 serves as a conductor layer of the source line SL that also serves as a source impurity layer. Accordingly, dynamic flash memory is formed on the substrate 20.

It should be noted that it is acceptable as long as the present dynamic flash memory element described in the present embodiment has a structure that satisfies the condition that the holes 11 generated through an impact ionization phenomenon or using a gate induced drain leakage current are retained in the channel region 7. To this end, it is acceptable as long as the channel region 7 has a floating body structure isolated from the substrate 1. Accordingly, even when the semiconductor base material of the channel region is formed horizontally on the substrate 1 using the GAA (Gate All Around; for example, see Non Patent Literature 11) technology, which is one of SGTs, or the nanosheet technology (for example, see Non Patent Literature 12), for example, the aforementioned dynamic flash memory operation can be performed. Alternatively, a device structure using SOI (Silicon On Insulator; for example, see Non Patent Literatures 7 to 10) may also be used. In such a device structure, the bottom of the channel region is in contact with an insulating layer of a SOI substrate, and the channel region is surrounded by a gate insulating layer and element isolation insulating layers together with other channel regions. Even in such a structure, the channel region has a floating body structure. In this manner, it is acceptable as long as the dynamic flash memory element provided by the present embodiment satisfies the condition that its channel region has a floating body structure. Further, even with a structure in which a Fin transistor (for example, see Non Patent Literature 13) is formed on a SOI substrate, the present dynamic flash memory operation can be performed as long as its channel region has a floating body structure.

It should be noted that in FIG. 1, the length in the central axis direction of the first gate conductor layer 5a connecting to the plate line PL is set further longer than the length in the central axis direction of the second gate conductor layer 5b connecting to the word line WL so that $C_{BL} > C_{WL}$. However, it is possible to reduce the capacitive coupling ratio ($C_{WL}$ ($C_{BL}+C_{WL}+C_{BL}+C_{SL}$)) of the word line WL to the channel region 7 only by adding the plate line PL. Consequently, potential fluctuation $\Delta V_{FB}$ of the channel region 7 as the floating body becomes small.

In addition, a fixed voltage of 2 V, for example, may be applied as the voltage $V_{ErasePL}$ of the plate line PL regardless of each operation mode. In addition, 0 V, for example, may be applied as the voltage $V_{ErasePL}$ of the plate line PL only during erasing. Further, a fixed voltage or a voltage that changes with time may be applied as the voltage $V_{ErasePL}$ of the plate line PL as long as such a voltage satisfies the condition that the dynamic flash memory operation can be performed.

Although description has been made with reference to FIGS. 5AA-5AC to 5HA-5HC using the Si pillars 22a to 22d with rectangular vertical cross-sections, the Si pillars 22a to 22d may also have trapezoidal vertical cross-sections. In addition, portions of the Si pillars 22a to 22d surrounded by the HfO$_2$ layer 27a and those surrounded by the HfO$_2$ layer 27b may have different vertical cross-sectional shapes, such as a rectangular shape and a trapezoidal shape. This is also true of a case where the Si pillars are horizontal with respect to the substrate 20.

In FIG. 1, in a portion of the channel region 7 surrounded by the insulating layer 6, potential distributions of the first channel region 7a and the second channel region 7b are formed continuously. Accordingly, the channel region 7 including the first channel region 7a and the second channel region 7b is continuous in the vertical direction across its region surrounded by the insulating layer 6.

In addition, as illustrated in FIGS. 5HA to 5HC, the N$^+$ layer 21 also serves as a wire conductor layer of the source line SL. As the source line SL, it is also possible to use a conductor layer, such as a W layer, for example, formed between portions of the N$^+$ layer 21 at the bottoms of the Si pillars 22a to 22d. Further, it is also possible to form a conductor layer of metal, such as a W layer, or alloy, for example, on the N$^+$ layer 21 on the outer side of the region where more Si pillars 22a to 22d are formed two-dimensionally.

In FIG. 1, the first gate conductor layer 5a connecting to the plate line PL is provided adjacent to the N$^+$ layer 3a connecting to the source line SL, and the second gate conductor layer 5b connecting to the word line WL is provided adjacent to the N$^+$ layer 3b connecting to the bit line BL, but it is also possible to connect the first gate conductor layer 5a to the word line WL and connect the second gate conductor layer 5b to the plate line PL. Further, one or both of the first gate conductor layer 5a and the second gate conductor layer 5b may be split into a plurality of conductor layers.

The present embodiment has the following features.
(Feature 1)

In the dynamic flash memory cell according to the first embodiment of the present invention, the voltage of the word line WL oscillates up and down while a write operation or a read operation is performed on the dynamic flash memory cell. At this time, the plate line PL performs the role of reducing the capacitive coupling ratio between the word line WL and the channel region 7. Consequently, it is possible to significantly suppress the influence of changes in the voltage of the channel region 7 when the voltage of the word line WL oscillates up and down. Accordingly, it is possible to increase the difference between the threshold voltages corresponding to logic levels of "0" and "1." This leads to an increased operation margin of the dynamic flash memory cell.
(Feature 2)

The N layers 8a and 8b in FIG. 1 suppress the flow of unwanted electrons into the channel region 7 from one or both of the N$^+$ layer 3a connecting to the source line SL and the N$^+$ layer 3b connecting to the bit line BL in the dynamic flash memory due to the voltage applied to each of the source line SL, the plate line PL, the word line WL, and the bit line BL or due to the influence of noise of capacitive coupling with the neighboring memory cells. In addition, as the intensity of an electric field in each of the regions of the N layers 8a and 8b can be made lower than when the N layers 8a and 8b are not provided, leakage current can be reduced. This leads to an improvement in the data retention characteristics. Accordingly, a stable operation of the dynamic flash memory can be achieved, leading to higher performance.
(Feature 3)

The N layer 25a illustrated in FIGS. 5HA to 5HC performs the role of suppressing the flow of unwanted electrons into the Si pillars 22a to 22d from the N$^+$ layer 21 and also performs the role of the sources or drains of the respective SGT transistors having the Si pillars 22a to 22d as their channels. In addition, the N$^+$ layer 21 also performs the role of a low-resistance connection electrode for the N layer 25a serving as the sources or drains. As illustrated in FIGS. 5HA to 5HC, the N layer 25a and the N$^+$ layer 21 are located below the Si pillars 22a to 22d and on the entire surface of the substrate 20. In addition, the N$^+$ layer 21 connects to a metal or alloy conductor layer provided in a region between or on the outer sides of the Si pillars 22a to 22d. Providing the N$^+$ layer 21 allows the voltage of the source line SL to be applied more uniformly to the N layer 25a below the Si pillars 22a to 22d. Accordingly, a stable data retention operation can be performed with the dynamic flash memory, leading to higher performance.

Second Embodiment

Figure 6:
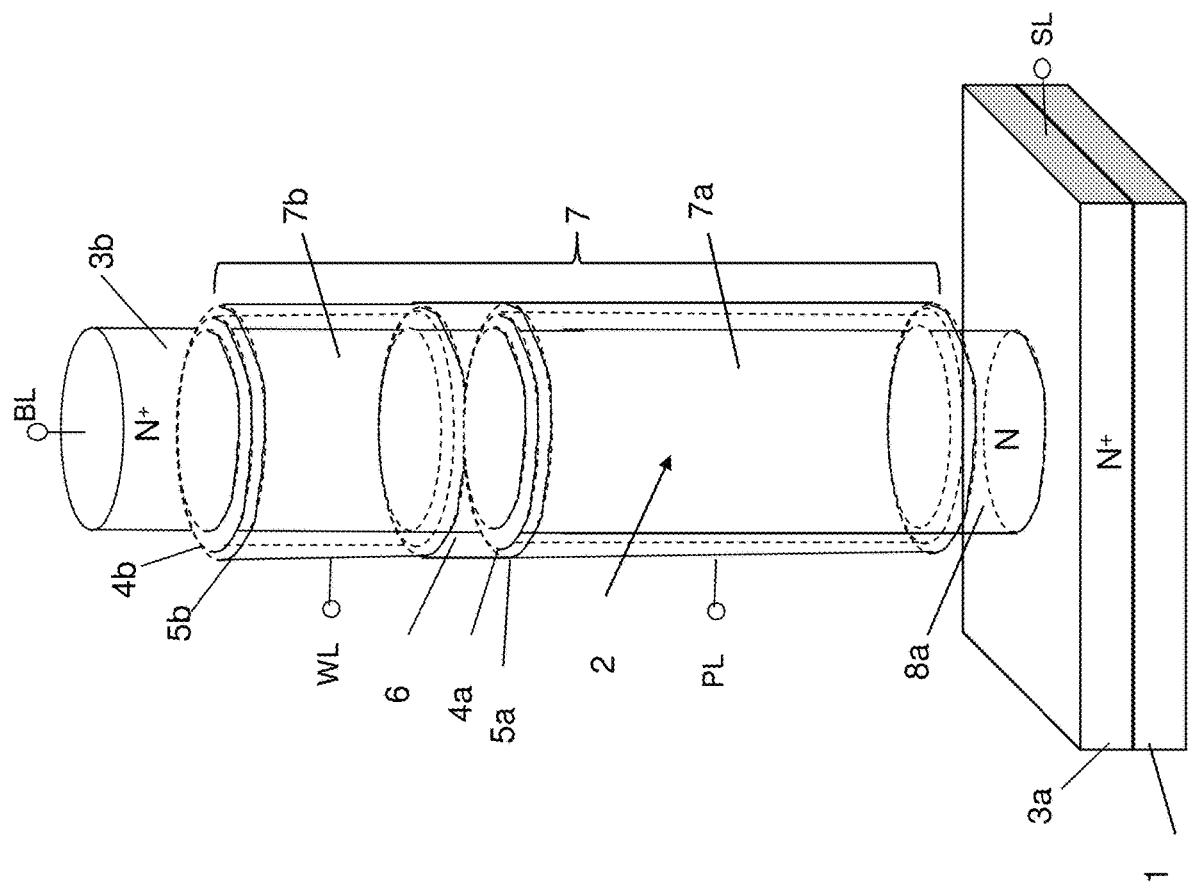
FIG. 6 is a view for illustrating a method for producing a memory device including SGTs according to a second embodiment.
Figure 7B:
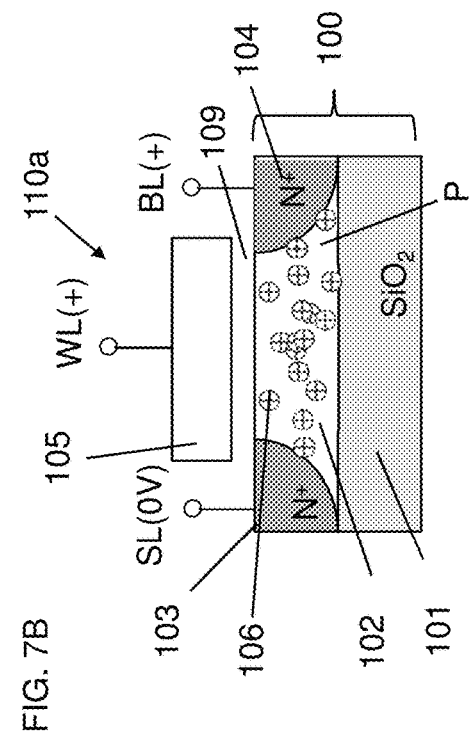
FIGS. 7A, 7B, 7C and 7D are views for illustrating problems with the operation of a conventional capacitorless DRAM memory cell.
Figure 7A:
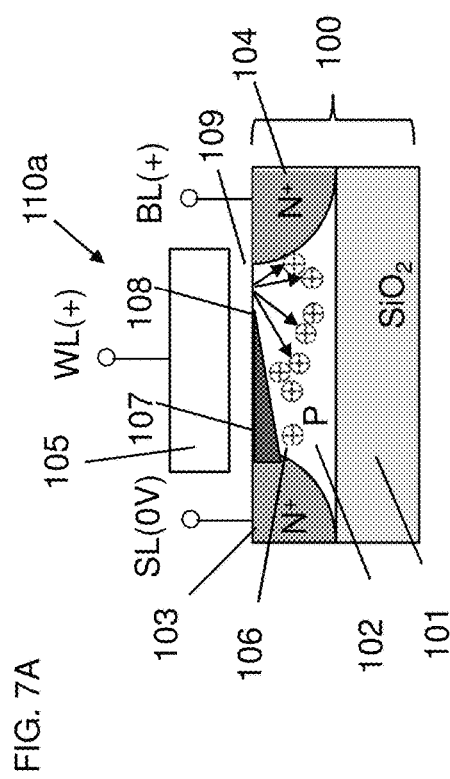
Figure 7C:
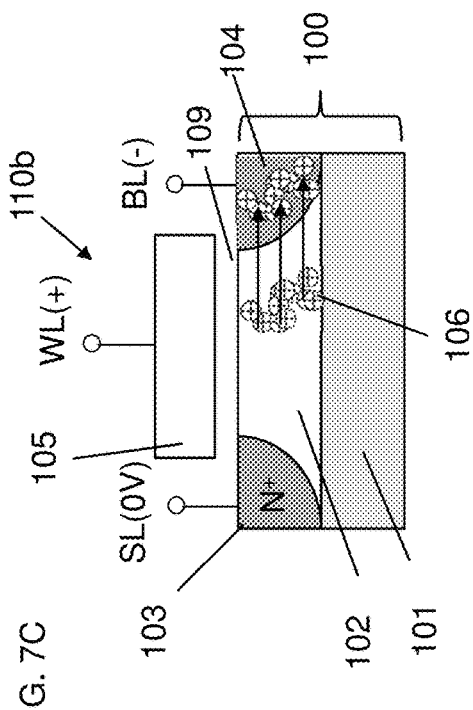
Figure 7D:
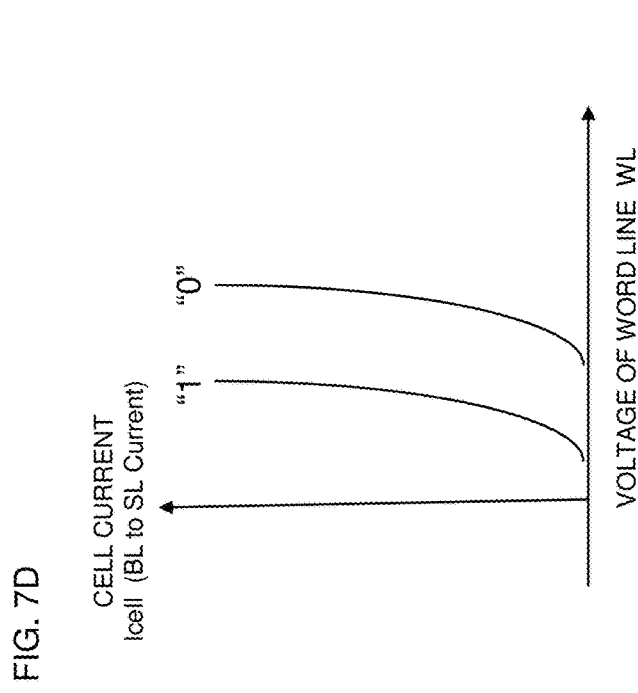
Figure 8A:
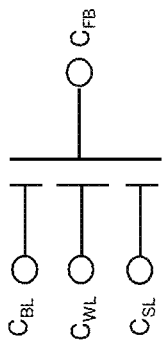
FIGS. 8A and 8B are views for illustrating problems with the operation of the conventional capacitorless DRAM memory cell.
Figure 8B:
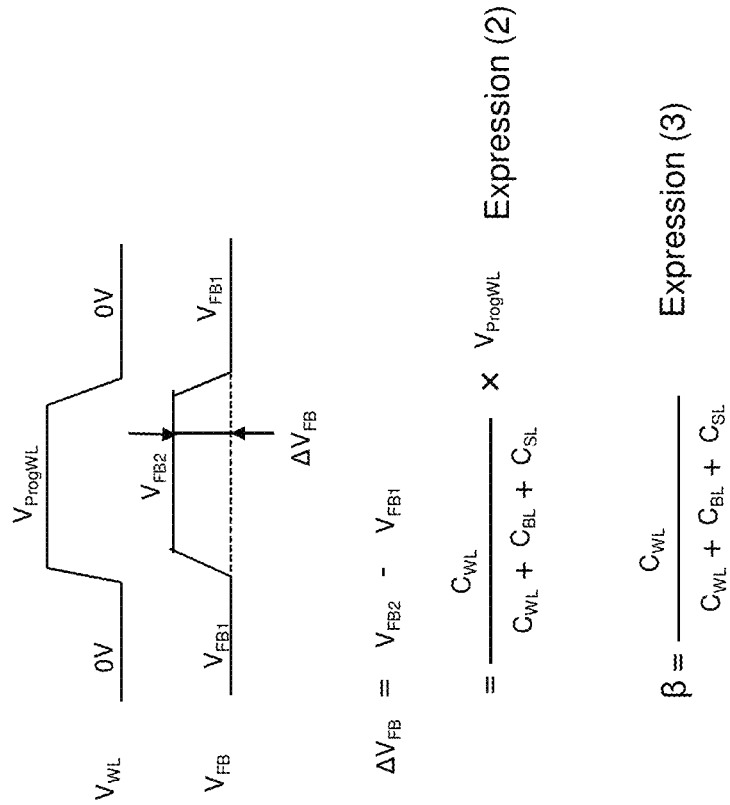

Dynamic flash memory of a second embodiment will be described with reference to FIG. 6. In FIG. 6, portions identical to or similar to those in FIG. 1 are denoted by identical reference signs.

As illustrated in FIG. 6, the N layer 8b in FIG. 1 is not provided between the N$^+$ layer 3b at the top of the Si pillar 2 and the channel region 7 in FIG. 1. The other portions are the same as those in FIG. 1.

The present embodiment has the following features.
(Feature 1)

As in the first embodiment, the N layer 8a suppresses the flow of unwanted electrons into the channel region 7 from the N$^+$ layer 3a connecting to the source line SL in the dynamic flash memory due to the voltage applied to each of the source line SL, the plate line PL, the word line WL, and the bit line BL or due to the influence of noise of capacitive coupling with the neighboring memory cells. In addition, since the N layer 8b in FIG. 1, which becomes series resistance, is not provided between the N$^+$ layer 3b and the channel region 7, a higher-speed operation of the dynamic flash memory can be achieved. In this manner, a stable operation of the dynamic flash memory can be achieved, and higher performance can be achieved.
(Feature 2)

Alternatively, even when the N layer 8a is not provided and the N layer 8b in FIG. 1 is provided between the channel region 7 and the N$^+$ layer 3b, advantageous effects similar to those described above can be obtained. In this manner, providing the N layer 8a or the N layer 8b in contact with the N$^+$ layer 3a or 3b can achieve a stable operation of the dynamic flash memory and also achieve higher performance.

Other Embodiments

Although the Si pillars 2 and 22a to 22d are formed in the aforementioned embodiments, it is also possible to form semiconductor pillars of a semiconductor material other than Si. This is also true of the other embodiments according to the present invention.

Each of the N$^+$ layers 3a, 3b, 21, and 23 in the first embodiment may also be formed of a layer of Si or other semiconductor materials containing donor impurities. In addition, the N$^+$ layers 3a, 3b, 21, and 23 may be formed of layers of different semiconductor materials. The N$^+$ layers may be formed using the epitaxial crystal growth method or other methods. Meanwhile, each of the N layers 25a, 25ba, 25bb, 25bc, and 25bd may also be formed of a layer of Si or other semiconductor materials containing donor impurities. The N layers may be formed using the epitaxial crystal growth method or other methods. Each of the N layers 8a, 8b, and 25ba to 25bd need not be uniform in the channel direction. This is also true of the other embodiments according to the present invention.

In the first embodiment, the TiN layer 28 is used as the plate line PL and the gate conductor layer 5a connecting to the plate line PL. In contrast, it is also possible to use a single conductor material layer or multiple conductor material layers combined together instead of the TiN layer 28. Likewise, the TiN layers 36a and 36b are used as the word lines WL and the gate conductor layers 5b connecting to the respective word lines WL. In contrast, it is also possible to use a single conductor material layer or multiple conductor material layers combined together instead of each of the TiN layers 36a, and 36b. In addition, the outer side of each gate TiN layer may connect to a wire metal layer of W, for example. This is also true of the other embodiments according to the present invention.

In FIGS. 5AA-5AC to 5HA-5HC, it is also possible to use low-resistance doped poly-Si instead of the TiN layer 28, and oxidize the upper surface thereof to form a SiO$_2$ layer as an interlayer dielectric between the gate conductor layer (which corresponds to the TiN layer 28) and each of the TiN layers 36a and 36b. In such a case, it is also possible to use two layers including a thin TiN layer and a thick low-resistance doped poly-Si layer as the gate conductor layer. This is also true of the other embodiments according to the present invention. In addition, it is also possible to use other conductor layers instead of low-resistance doped poly-Si. This is also true of the other embodiments according to the present invention.

In the first embodiment, the shape of each of the Si pillars 22a to 22d as seen from its central axis direction is circular. However, it may be circular, elliptical, or a shape elongated in one direction, for example. It is also possible to form Si pillars with different shapes as seen in plan view in a mixed manner in a logic circuit region, which is formed away from the region of the dynamic flash memory cells, in accordance with the logic circuit design. This is also true of the other embodiments according to the present invention.

Regarding FIG. 1, description has been made using the Si pillar 2 with a rectangular vertical cross-section. However, the vertical cross-sectional shape may also be trapezoidal. Further, the vertical cross-sectional shape of a portion of the Si pillar 2 surrounded by the first gate insulating layer 4a and that surrounded by the second gate insulating layer 4b may differ, such as a rectangular shape and a trapezoidal shape. This is also true of the other embodiments according to the present invention.

In the description of the first embodiment, the source line SL is negative-biased during an erase operation so that holes in the channel region 7 functioning as the floating body FB are pulled out. However, it is also possible to perform an erase operation by negative-biasing the bit line BL instead of the source line SL, or negative-biasing the source line SL and the bit line BL. Alternatively, an erase operation may be performed under other voltage conditions. This is also true of the other embodiments according to the present invention.

In the steps illustrated in FIGS. 5AA-5AC to 5HA-5HC, the N layers 25a and 25ba to 25bd are formed using the epitaxial growth method. In contrast, the N layers 25a and 25ba to 25bd may also be formed using the ion implantation method. Alternatively, it is also possible to form the N layers 25a and 25ba to 25bd by diffusing donor impurities from the N$^+$ layers 21 and 23a to 23d through heat treatment. Such heat treatment may be performed through rapid thermal annealing treatment in a short time. In such a case, the N layers 25A and 25B need not be formed in the step of FIGS. 5AA to 5AC. This is also true of the other embodiments according to the present invention.

In addition, in FIGS. 5AA-5AC to 5HA-5HC, the bottom N layer 25a and N$^+$ layer 21 connecting to the source line SL are formed such that they are continuous at the bottoms of the Si pillars 22a to 22d. In contrast, it is also possible to form as the bottom N layer and N$^+$ layer connecting to the source line SL, as seen in plan view, an N layer and an N$^+$ layer that are continuous at the bottoms of the Si pillars 22a and 22b, and an N layer and an N$^+$ layer that are electrically isolated therefrom and are continuous at the bottoms of the Si pillars 22c and 22d. In addition, it is also possible to form as the bottom N layer and N$^+$ layer connecting to the source line SL, as seen in plan view, an N layer and an N$^+$ layer that are continuous at the bottoms of the Si pillars 22a and 22c, and an N layer and an N$^+$ layer that are electrically isolated therefrom and are continuous at the bottoms of the Si pillars 22b and 22d. The electrical isolation between such N layers and N$^+$ layers connecting to the source line SL is achieved using a well structure or SOI, for example. Accordingly, the source line connecting to the N layer and the N$^+$ layer at the bottoms of the Si pillars 22a and 22b and the source line SL connecting to the N layer and the N$^+$ layer at the bottoms of the Si pillars 22c and 22d can be driven independently. Alternatively, the source line connecting to the N layer and the N$^+$ layer at the bottoms of the Si pillars 22a and 22c and the source line SL connecting to the N layer and the N$^+$ layer at the bottoms of the Si pillars 22b and 22d can be driven independently. In such a case, it is desirable to provide a conductor layer of metal or alloy, for example, such that it connects to both the isolated N layers and N$^+$ layers or the isolated N$^+$ layers. This is also true of the other embodiments according to the present invention.

In addition, in FIGS. 5AA-5AC to 5HA-5HC, the TiN layer 28 is formed continuous around the Si pillars 22a to 22d. In contrast, it is also possible to separately form as the TiN layer a gate conductor layer that is continuous around the Si pillars 22a and 22b and a gate conductor layer that is continuous around the Si pillars 22c and 22d. Accordingly, the separate gate conductor layers can be driven independently. This is also true of the other embodiments according to the present invention.

Further, in FIG. 1, the position of the upper end of the N layer 8a in the channel direction may overlap the first gate conductor layer 5a. Similarly, the position of the lower end of the N layer 8b in the channel direction may overlap the second gate conductor layer 5b. This is also true of the other embodiments according to the present invention.

The present invention can be implemented in various embodiments and modifications without departing from the broad spirit and scope of the present invention. In addition, each of the aforementioned embodiments only describes an example of the present invention and is not intended to limit the scope of the present invention. The aforementioned examples and modified examples can be combined as appropriate. Further, even if some of the components of the aforementioned embodiments are removed as needed, the resulting structure is within the technical idea of the present invention.

INDUSTRIAL APPLICABILITY

With the memory device using the semiconductor elements according to the present invention, it is possible to obtain high-density and high-performance dynamic flash memory.

The invention claimed is:

1. A memory device using semiconductor elements, comprising:
   a semiconductor base material provided on a substrate in a manner standing in an upright position along a vertical direction or extending in a horizontal direction with respect to the substrate;
   a first impurity layer and a second impurity layer having the same conductivity type and continuous with opposite ends of the semiconductor base material;
   a first gate insulating layer partially or entirely surrounding a side face of the semiconductor base material on a side of the first impurity layer;
   a second gate insulating layer continuous with the first gate insulating layer, and partially or entirely surrounding the side face of the semiconductor base material on a side of the second impurity layer;
   a first gate conductor layer covering the first gate insulating layer;
   a second gate conductor layer covering the second gate insulating layer; and
   a third impurity layer provided between one or each of the first impurity layer and the second impurity layer and the semiconductor base material, the third impurity layer being provided in, in a central axis direction of the semiconductor base material, one or each of a region between the first gate conductor layer and the first impurity layer and a region between the second gate conductor layer and the second impurity layer, the third impurity layer having the same conductivity type as the first impurity layer and the second impurity layer, and being in contact with one efor each of the first impurity layer and the second impurity layer,
   wherein:
   each of a memory write operation, a memory read operation, and a memory erase operation is performed by controlling a voltage applied to each of the first impurity layer, the second impurity layer, the first gate conductor layer, and the second gate conductor layer.

2. The memory device using the semiconductor elements according to claim 1, wherein a concentration of impurities in the third impurity layer is lower than a concentration of impurities in each of the first impurity layer and the second impurity layer and is higher than a concentration of impurities in the semiconductor base material.

3. The memory device using the semiconductor elements according to claim 1, wherein the third impurity layer is formed at a position continuous with the second impurity layer.

4. The memory device using the semiconductor elements according to claim 1, wherein the third impurity layer is formed at a position continuous with the first impurity layer.

5. The memory device using the semiconductor elements according to claim 1, wherein the third impurity layer is formed at each of a position continuous with the first impurity layer and a position continuous with the second impurity layer.

6. The memory device using the semiconductor elements according to claim 1, wherein a first gate capacitance between the first gate conductor layer and the semiconductor base material is larger than a second gate capacitance between the second gate conductor layer and the semiconductor base material.

7. The memory device using the semiconductor elements according to claim 1, wherein the third impurity layer extends to an end portion of the semiconductor base material and to an outer peripheral portion continuous with the end portion.

8. The memory device using the semiconductor elements according to claim 7, wherein:
   the semiconductor base material stands in an upright position along the vertical direction with respect to the substrate, and
   the first impurity layer and the third impurity layer continuous with the semiconductor base material extend to an outer side of the semiconductor base material as seen in plan view.

9. The memory device using the semiconductor elements according to claim 1,
   wherein:
   the memory write operation is performed by controlling a voltage applied to each of the first impurity layer, the second impurity layer, the first gate conductor layer, and the second gate conductor layer to perform an operation of generating electrons and holes in the semiconductor base material through an impact ionization phenomenon based on a current flowed between the first impurity layer and the second impurity layer or using a gate induced drain leakage current, to perform an operation of removing, from among the generated electrons and holes, the electrons or the holes that are minority carriers in the semiconductor base material, and to perform an operation of causing the electrons or the holes that are majority carriers in the semiconductor base material to partially or entirely remain in the semiconductor base material; and
   the memory erase operation is performed by controlling a voltage applied to each of the first impurity layer, the second impurity layer, the first gate conductor layer, and the first gate conductor layer to remove from the semiconductor base material the electrons or the holes that are the majority carriers remaining in the semiconductor base material.

* * * * *

UNITED STATES PATENT AND TRADEMARK OFFICE
CERTIFICATE OF CORRECTION

| | |
|---|---|
| PATENT NO. | : 12,101,925 B2 |
| APPLICATION NO. | : 17/739849 |
| DATED | : September 24, 2024 |
| INVENTOR(S) | : Nozomu Harada and Koji Sakui |

It is certified that error appears in the above-identified patent and that said Letters Patent is hereby corrected as shown below:

In the Claims

Column 19, Claim 1, Line 56, delete "efor" and replace with --or--

Signed and Sealed this
Fifth Day of November, 2024

Katherine Kelly Vidal
*Director of the United States Patent and Trademark Office*